(12) United States Patent
Khoury

(10) Patent No.: US 11,817,868 B2
(45) Date of Patent: Nov. 14, 2023

(54) APPARATUS FOR DIGITAL FREQUENCY SYNTHESIZER WITH SIGMA-DELTA MODULATOR AND ASSOCIATED METHODS

(71) Applicant: Silicon Laboratories Inc., Austin, TX (US)

(72) Inventor: John M. Khoury, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 17/855,525

(22) Filed: Jun. 30, 2022

(65) Prior Publication Data
US 2022/0337254 A1 Oct. 20, 2022

Related U.S. Application Data

(63) Continuation of application No. 16/221,436, filed on Dec. 14, 2018.

(51) Int. Cl.
| H03L 7/099 | (2006.01) |
| H03L 7/085 | (2006.01) |
| G06F 1/02 | (2006.01) |
| H03B 5/12 | (2006.01) |
| H03L 7/14 | (2006.01) |
| H03L 7/189 | (2006.01) |
| H03L 7/197 | (2006.01) |

(52) U.S. Cl.
CPC .......... *H03L 7/0991* (2013.01); *G06F 1/022* (2013.01); *H03B 5/1206* (2013.01); *H03B 5/1212* (2013.01); *H03B 5/1218* (2013.01); *H03B 5/1228* (2013.01); *H03B 5/1243* (2013.01); *H03B 5/1265* (2013.01); *H03L 7/085* (2013.01); *H03L 7/099* (2013.01); *H03L 7/0992* (2013.01); *H03L 7/148* (2013.01); *H03L 7/189* (2013.01); *H03L 7/1974* (2013.01)

(58) Field of Classification Search
CPC .. H03B 5/1206; H03B 5/1212; H03B 5/1218; H03B 5/1228; H03B 5/1243; H03B 5/1265; H03L 7/085; H03L 7/099; H03L 7/0992; H03L 7/148; H03L 7/189; H03L 7/1974; H03L 7/0991; G06F 1/022
USPC .............. 331/167, 177 V, 179, 1 A; 375/376
See application file for complete search history.

(56) References Cited

U.S. PATENT DOCUMENTS

| 6,906,596 B2* | 6/2005 | Kitamura | ................ H03L 7/099 455/180.4 |
| 7,394,418 B2* | 7/2008 | Eikenbroek | ........... H03L 7/1976 341/131 |
| 8,514,118 B2 | 8/2013 | Eldredge | |

(Continued)

OTHER PUBLICATIONS

Galton, I., "Delta-Sigma Fractional-N Phase-Locked Loops," May 2017, 11 pages.

*Primary Examiner* — Arnold M Kinkead
(74) *Attorney, Agent, or Firm* — Zagorin Cave LLP

(57) ABSTRACT

An apparatus includes a digitally controlled oscillator (DCO), which includes an inductor coupled in series with a first capacitor. The DCO further includes a second capacitor coupled in parallel with the series-coupled inductor and first capacitor, a first inverter coupled in parallel with the second capacitor, and a second inverter coupled back-to-back to the first inverter. The DCO further includes a digital-to-analog-converter (DAC) to vary a capacitance of the first capacitor.

22 Claims, 26 Drawing Sheets

(56) References Cited

U.S. PATENT DOCUMENTS

| | | | |
|---|---|---|---|
| 9,071,193 B1* | 6/2015 | Caviglia | ............... H03B 5/1212 |
| 9,461,653 B2 | 10/2016 | Perrott | |
| 2003/0174799 A1* | 9/2003 | Fahim | ................... H03L 7/1976 |
| | | | 375/376 |
| 2007/0018739 A1* | 1/2007 | Gabara | ..................... G06F 1/10 |
| | | | 331/167 |
| 2022/0337255 A1 | 10/2022 | Khoury | |

* cited by examiner

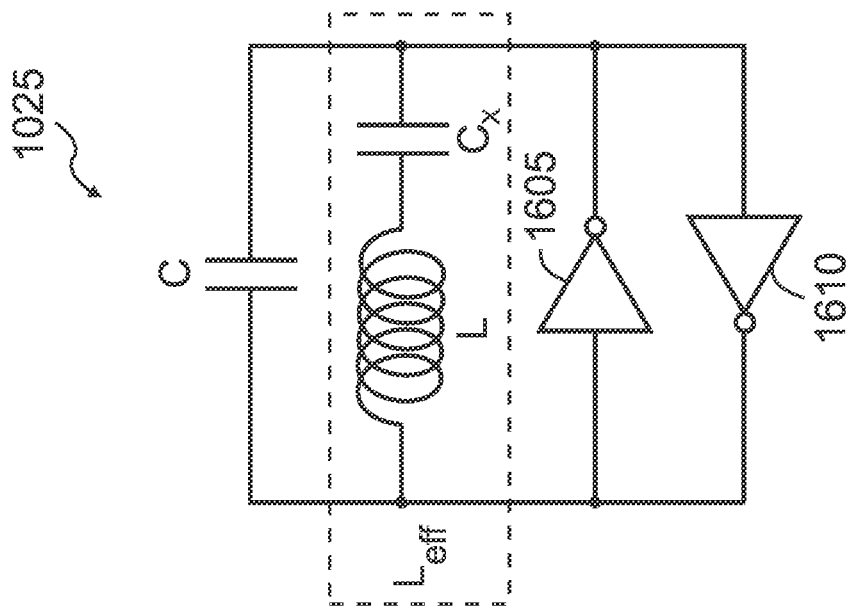
Fig. 17
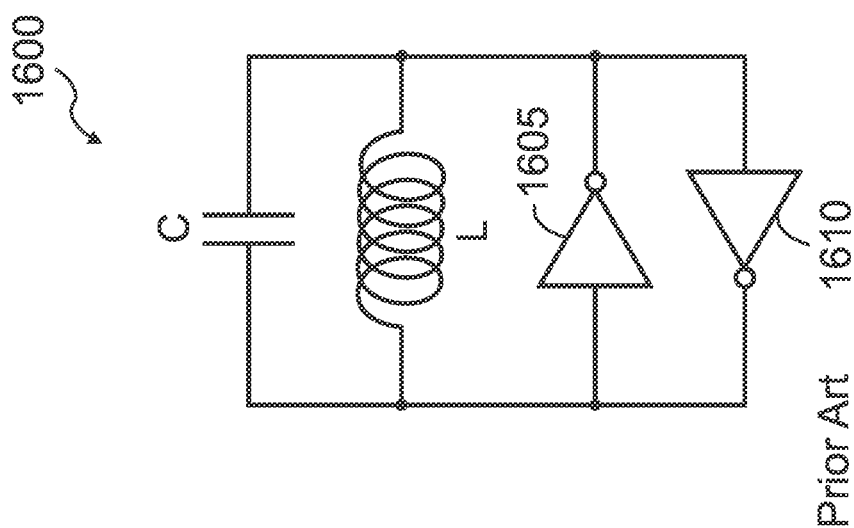
Prior Art    Fig. 16

APPARATUS FOR DIGITAL FREQUENCY SYNTHESIZER WITH SIGMA-DELTA MODULATOR AND ASSOCIATED METHODS

CROSS-REFERENCE TO RELATED APPLICATIONS

This application is a continuation of, and incorporates by reference in its entirety for all purposes, U.S. patent application Ser. No. 16/221,436, filed on Dec. 14, 2018, titled 'Apparatus for Digital Frequency Synthesizer with Sigma-Delta Modulator and Associated Methods.' This application is related to the following U.S. Patent Applications: U.S. patent application Ser. No. 16/221,426, filed on Dec. 14, 2018, titled 'Apparatus for Digital Frequency Synthesizers and Associated Methods'; and U.S. patent application Ser. No. 16/221,130, filed on Dec. 14, 2018, titled 'Apparatus for Time-to-Digital Converters and Associated Methods.'

TECHNICAL FIELD

The disclosure relates generally to signal generation apparatus and methods and, more particularly, to apparatus including digitally controlled oscillators (DCOs), and associated methods.

BACKGROUND

With the increasing proliferation of wireless technology, such as Wi-Fi, Bluetooth, and mobile or wireless Internet of things (IoT) devices, more devices or systems incorporate RF circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry. Typically, receiver and/or transmitter circuitry use one or more signals to perform a variety of functions, such as clocking circuitry (e.g., analog-to-digital converters (ADCs)), image reject calibration, mixing radio frequency (RF) signals to baseband or an intermediate frequency (IF), mixing a baseband or IF signal to RF signals, and the like.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes a digitally controlled oscillator (DCO), which includes an inductor coupled in series with a first capacitor. The DCO further includes a second capacitor coupled in parallel with the series-coupled inductor and first capacitor, a first inverter coupled in parallel with the second capacitor, and a second inverter coupled back-to-back to the first inverter. The DCO further includes a digital-to-analog-converter (DAC) to vary a capacitance of the first capacitor. More particularly, the capacitance of the first capacitor is varied for relatively fine frequency control of the frequency of the output signal of the DCO. More particularly, the DAC varies a capacitance of the second capacitor for relatively coarse frequency control of the output signal of the DCO.

According to another exemplary embodiment, an apparatus includes a DCO, which includes a first capacitor having first and second terminals; a first inductor having first and second terminals, wherein the first terminal is dotted and is coupled to the first terminal of the first capacitor; and a second inductor having first and second terminals, wherein the first terminal is dotted and is coupled to the second terminal of the first capacitor. The DCO further includes a set of capacitors coupled in a Π-configuration, wherein a first terminal of the Π-configuration is coupled to the second terminal of the first inductor, and the second terminal of the Π-configuration is coupled to the second terminal of the second inductor.

According to another exemplary embodiment, an apparatus includes a DCO, which includes a first capacitor having first and second terminals; a first inductor having first and second terminals, wherein the first terminal is dotted and is coupled to the first terminal of the first capacitor; and a second inductor having first and second terminals, wherein the first terminal is dotted, and wherein the second terminal is coupled to the second terminal of the first capacitor. The DCO further includes a set of capacitors coupled in a Π-configuration, wherein a first terminal of the Π-configuration is coupled to the second terminal of the first inductor, and the second terminal of the Π-configuration is coupled to the first terminal of the second inductor.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

FIG. 16 shows a circuit arrangement of a conventional inductor-capacitor (LC) oscillator.

FIG. 17 shows a circuit arrangement of a single-ended digitally controlled inductor-capacitor (LC) oscillator (DCO) according to an exemplary embodiment.

DETAILED DESCRIPTION

Figure 1A:
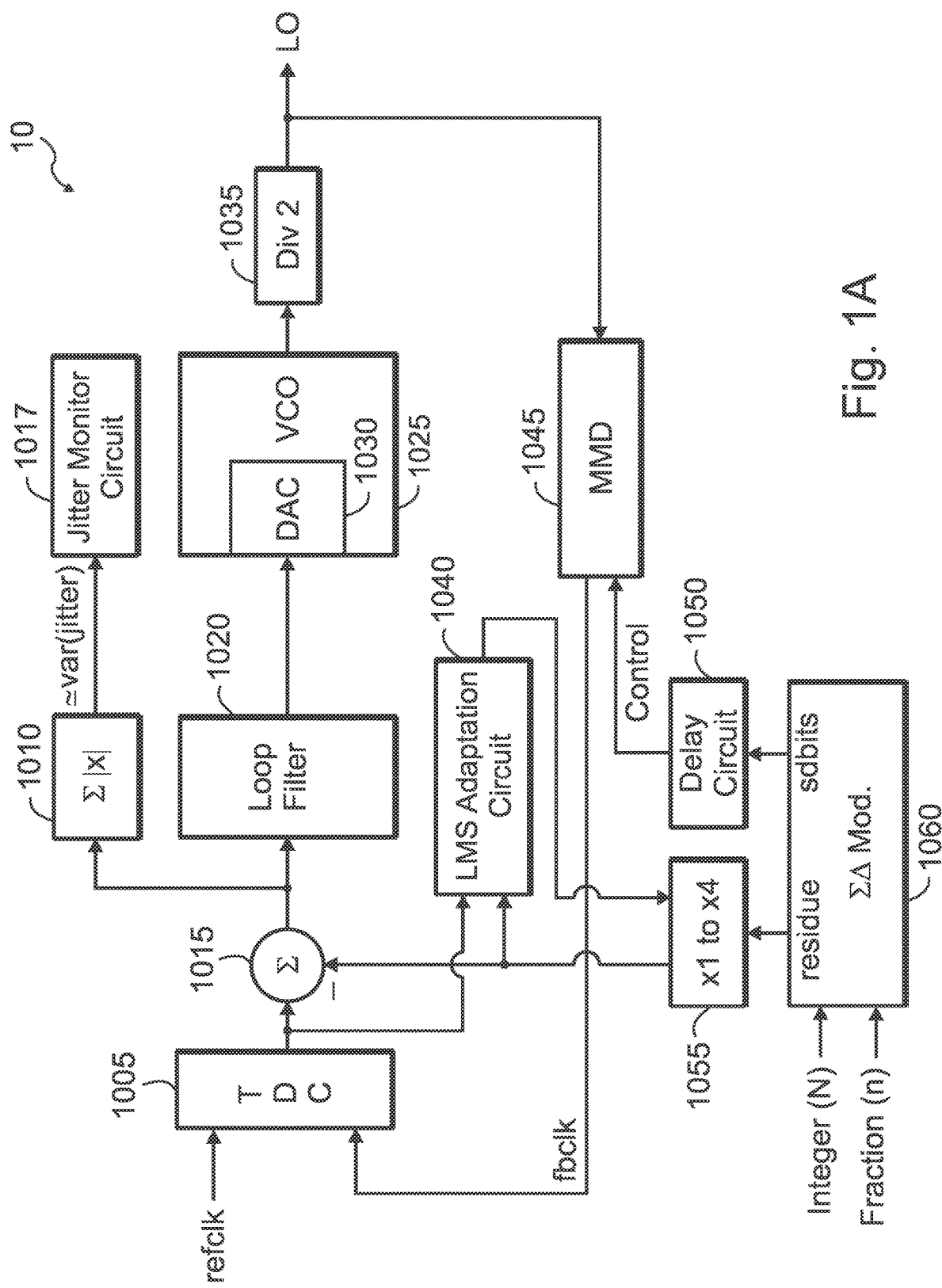
FIGS. 1A and 1B show circuit arrangements for DFSs according to exemplary embodiments.

One aspect of the disclosure relates to DFSs. DFSs according to various embodiments may be used in a variety of apparatus, subsystems, systems, modules, ICs, and the like. Without limitation, examples include RF receivers, RF transmitters, and RF transceivers.

DFSs are beneficial from an area viewpoint, since the loop filter (charge pump, capacitor, and resistor in an analog implementation) is implemented digitally. A fewer number of circuits include strictly analog or mixed-signal components in the DFS, such as the TDC and the DCO. A DFS offers lower area, higher immunity to semiconductor fabrication process variations, easier programmability, and more rapid migration to new technology nodes than the conventional analog approach to frequency synthesizers.

DFSs according to exemplary embodiments employ fractional-N phase-locked loops (PLLs) with residue cancellation. The fractional divider control is realized with a sigma-delta modulator (SDM). The residue cancellation is performed with a digital subtracter at the output of the TDC. In contrast, an analog PLL typically uses a DAC to implement residue cancellation. In the analog system, the linearity and gain of the residue DAC, phase detector, and charge pump have relatively high influence on the performance of analog synthesizers. In DFSs according to various embodiments, fewer parameters, such as the gain and linearity of the TDC, have relatively high impact on DFS performance. Additionally, the gain error of the TDC can be compensated completely in the digital domain. As described below in detail, a measurement of the RMS phase error after the residue cancellation is used to digitally adjust the gain of the residue path to increase or maximize the residue cancellation and minimize the RMS phase error of the DFS.

As noted above, another aspect of the disclosure relates to TDCs. With a digital loop filter, as used in exemplary embodiments, the phase error between the reference input signal (refclk) and the feedback clock or signal is converted to a digital output, and used to lock the DFS. This conversion of the error signal to a digital signal is performed in exemplary embodiments by the TDC.

TDCs according to exemplary embodiments can be arbitrarily long loops because the delay line is implemented as a ring. The signal propagates down the line, but can wrap around multiple times so that much longer total delays can be realized. Each time the signal wraps around, another latch in a string of latches is set to keep count of how many complete cycles are made. Such TDCs can yield relatively fine steps, e.g. 22 ps in a 40-nm semiconductor fabrication node, even though such fine resolution is used near the locked position. On the other hand, larger phase errors can tolerate a coarser TDC. Accordingly, in exemplary embodiments, a CTDC is used together with a fine TDC (FTDC or F-TDC), which can span the entire $2\pi$ range. A vernier technique, which is known to persons of ordinary skill in the art, may be used, as desired, as an enhancement to such TDCs.

TDCs according to various embodiments provide a number of benefits. First, they use fully digital circuitry, which results in lower size/circuit area, and increased simplicity. Second, the use of a wrapping around architecture, described below in detail, saves area and clock signal power. In addition, the coarse TDC (CTDC or C-TDC) in exemplary embodiments saves size/circuit area, reduces power consumption, and reduces or minimizes jitter accumulation (versus a design that uses all fine steps to cover the entire $2\pi$ range).

As noted above, another aspect of the disclosure relates to DCOs. With a digital loop filter, as is used in DFSs according to exemplary embodiments, the digital output of the loop filter (or a signal derived from the output signal of the digital loop filter) controls the oscillator, typically an LC oscillator. In exemplary embodiments, a digital-to-analog converter (DAC) is included in the LC voltage-controlled oscillator (VCO) circuitry. Controlling the VCO's frequency is achieved by varying the capacitance of the LC tank by using the output signal of the DAC. In other words, the digital output signal of the digital loop filter is used to digitally program the value of the capacitance of the LC tank and, hence, the VCO's output frequency.

Conventional techniques to digitally control the frequency of an LC oscillator cannot achieve fine frequency resolution by capacitor selection since capacitors would be relatively small and difficult to implement, as noted above. In a conventional implementation, the capacitors that are switched (to vary the capacitance of the LC tank) would be on the order of aF (i.e., $10^{-15}$ F) range to obtain relatively fine frequency resolution. As described below in detail, the DCO topology according to exemplary embodiments uses two inductors and two sets of capacitors. Such a topology offers relatively wide tuning range and relatively fine frequency steps which, together make reasonable sizes of DCO frequency control words feasible with realizable capacitor size selection.

Alternative conventional approach utilize a sigma-delta modulator to drive a switchable capacitor. The ones density of the modulator is then used to implement a fractional value of the capacitor from 0 to 1 times the actual capacitance. The sigma-delta modulation to achieve the effective value of the fractional capacitor uses digital hardware that consumes power, uses additional circuit area, and can introduce switching spurs in the clock output. DCOs according to exemplary embodiments do not employ sigma-delta modulators and, in the locked condition, infrequently toggle a capacitor, that is effectively relatively small (relatively low capacitance), to maintain phase lock of the DFS.

FIG. 1A shows a circuit arrangement for a DFS 10 according to an exemplary embodiment. DFS 10 employs a negative feedback loop. More specifically, as noted above, TDC 1005 converts to a digital value the phase difference between reference clock refclk and feedback clock fbclk, provided by multi-modulus divider (MMD) 1045. MMD 1045 divides the nominal (or desired) frequency of the output signal of DFS 10 (labeled as "LO") by a number that can be an integer or integer plus fraction. The negative feedback loop causes the MMD output signal to have the same average frequency as the frequency of the reference signal. The negative feedback loop acts to minimize the frequency and phase errors in the output signal of DFS 10.

The output signal of TDC 1005 is provided to subtracter 1015. An output signal of scaling circuit 1055 (described below) is provided to another input of subtracter 1015. The difference between the two signals, i.e., the output signal of subtracter 1015, is provided to digital loop filter 1020, which performs digital filtering on the output signal of subtracter 1015. In exemplary embodiments, digital loop filter 1020 may have a desired order, such as first-order filter, second-order filter, etc., as persons of ordinary skill in the art understand. The choice of filter order and the resulting circuitry for a given implementation depends on a variety of factors, such as design specifications, performance specifications, cost, IC or device area, available technology (e.g., semiconductor fabrication technology), target markets, target end-users, etc., as persons of ordinary skill in the art will understand. The filtered signal at the output of digital loop filter 1020 drives DCO 1025. DCO 1025 includes a DAC 1030, which converts the output of digital loop filter 1020 to program an array of capacitors in the VCO circuitry of DCO 1025.

The output signal of DCO 1025 is provided to divider 1035. Divider 1035 divides the frequency of its input signal by a desired value, such as 2 (hence the label "Div 2") in the example shown, although other values may be used, as desired. The output signal of divider 1035 constitutes the output signal of DFS 10, labeled as "LO." The output signal of DFS 10 drives MMD 1045, as noted above.

Note that, depending on the desired frequency of the output signal of DFS 10 and the available frequency of refclk, divider 1035 may be omitted in some embodiments, as persons of ordinary skill in the art will understand. Furthermore, note that MMD 1045 may be optional in some embodiments. Specifically, if the desired output frequency of DFS 10 is equal (or nearly equal in a practical implementation) to the reference frequency, MMD 1045 may be omitted, and the output signal of DFS 10 fed back to the input of TDC 1005.

The integer and fractional values for DFS 10 are provided to SDM 1060 (e.g., if an overall value of 64.3 is desired, then the integer (N) and fractional (n) values provided to SDM 1060 are N=64 and n=0.3, respectively). In response, SDM 1060 generates an output signal sdbits, and a residue signal. The output signal sdbits is provided to delay circuit 1050, which delays sdbits by a desired delay value. The delayed signal is used to control MMD 1045, i.e., select the desired modulus for MMD 1045. In exemplary embodiments, the delay provided by delay circuit 1050 is selected to match the delay of scaling circuit 1055.

The residue signal from SDM 1060 is provided to scaling circuit 1055. Scaling circuit 1055 multiplies the residue signal by a value selected from of ×1 through ×4 (or other values and/or numbers of values, as desired), which represent scaling values. The scaling values scale the residue value to match the gain of TDC 1005. The output of scaling circuit 1055 is provided to subtracter 1015, as noted above.

The output of scaling circuit 1055 is also provided to least-mean-square (LMS) adaptation circuit 1040. The output of TDC 1005 is also provided to LMS adaptation circuit 1040. The output of LMS adaptation circuit 1040 is used to select a scaling value in scaling circuit 1055, e.g., one of ×1 through ×4 in the example shown. As a result, a feedback loop is formed around LMS adaptation circuit 1040 and scaling circuit 1055, where in response to the levels of phase error at the output of TDC 1005 and the scaled residue from scaling circuit 1055, LMS adaptation circuit 1040 causes changes in the gain (scaling factor) of scaling circuit 1055 to reduce or minimize the impact of residue on DFS 10, i.e., perform residue cancellation. In other words, the level of phase error at the output of TDC 1005 is used to select a gain (scaling factor) of scaling circuit 1055 to cause cancellation of the residue or effect of residue. Viewed another way, the gain or scaling factor of scaling circuit 1055 is selected or set so as to reduce or cancel the phase error attributable to the residue signal.

Under ideal locked conditions, the phase error from TDC 1005 will be exactly equal to the value predicted by the scaled residue, i.e., the output of scaling circuit 1055, i.e., the output of TDC 1005 equals the output of scaling circuit 1055, which results in a zero output for subtracter 1015. However, in a practical implementation, gain errors in TDC 1005 cause the output of subtracter 1015 to be finite, i.e., non-zero. LMS adaptation circuit 1040 tracks the magnitude of the phase error from TDC 1005 (the output signal of TDC 1005) versus the scaled residue (the output of scaling circuit 1055) and in a relatively slow manner (to allow the changes to settle in various circuitry) increments or decrements the gain of scaling circuit 1055 to drive the difference between the scaled residue and the TDC phase error to zero (or near zero, in a practical implementation). Thus, LMS adaptation circuit uses least-mean-square techniques combined with feedback to drive the output of subtracter 1015 to zero (or near zero) by changing the gain of scaling circuit 1055. In this manner, scaling circuit 1055 operates as an adapting or adaptive scaling circuit.

In some embodiments, the incremental gain change occurs once per phase measurement (i.e., once per cycle of the reference clock, refclk), and is chosen to be relatively small, for instance, less than 1% of the nominal scaling factor or gain of scaling circuit 1055. In some embodiments, the adaptation or adaptive functionality of LMS adaptation circuit 1040 can be enabled or disabled during DFS operation. For example, in some embodiments, to prevent divergence of the LMS adaptation, LMS adaptation circuit 1040 may be disabled if the TDC phase error (output of TDC 1005) is relatively large, indicating that the DFS has not yet achieved phase lock.

The output of subtracter 1015 is provided to residue error circuit 1010. When the feedback loop in DFS 10 is locked, the input to digital loop filter 1020 should have a zero value. Residue error circuit 1010 generates an output signal that represents roughly the variance of the jitter (sum of absolute values of the outputs of subtracter 1015, obtained, for example, by using an integrate/dump technique), i.e., a measure of the gain match between the residue signal from SDM 1060 and the gain of TDC 1005. The jitter represents quantized jitter of SDM 1060. The output signal of residue error circuit 1010 is provided to jitter monitor circuit 1017. By examining the jitter variance at the output of subtracter 1015, as measured by residue circuit 1010 and monitored by jitter monitor circuit 1017, a measure of the quality of the reference signal and/or the convergence of the LMS adaptation function, described above, can be obtained. Monitoring by jitter monitor circuit 1017 can be used by DFS 10 (or another block or circuit in a system or apparatus that includes DFS 10) to determine potential degradation in the LO phase noise without making direct phase noise measurements. Additionally, if DFS 10 does not implement the LMS adaptation functionality, then the monitored jitter may be used to calibrate residue calibration circuit 1005, as described below in connection with FIG. 1B.

Figure 1B:
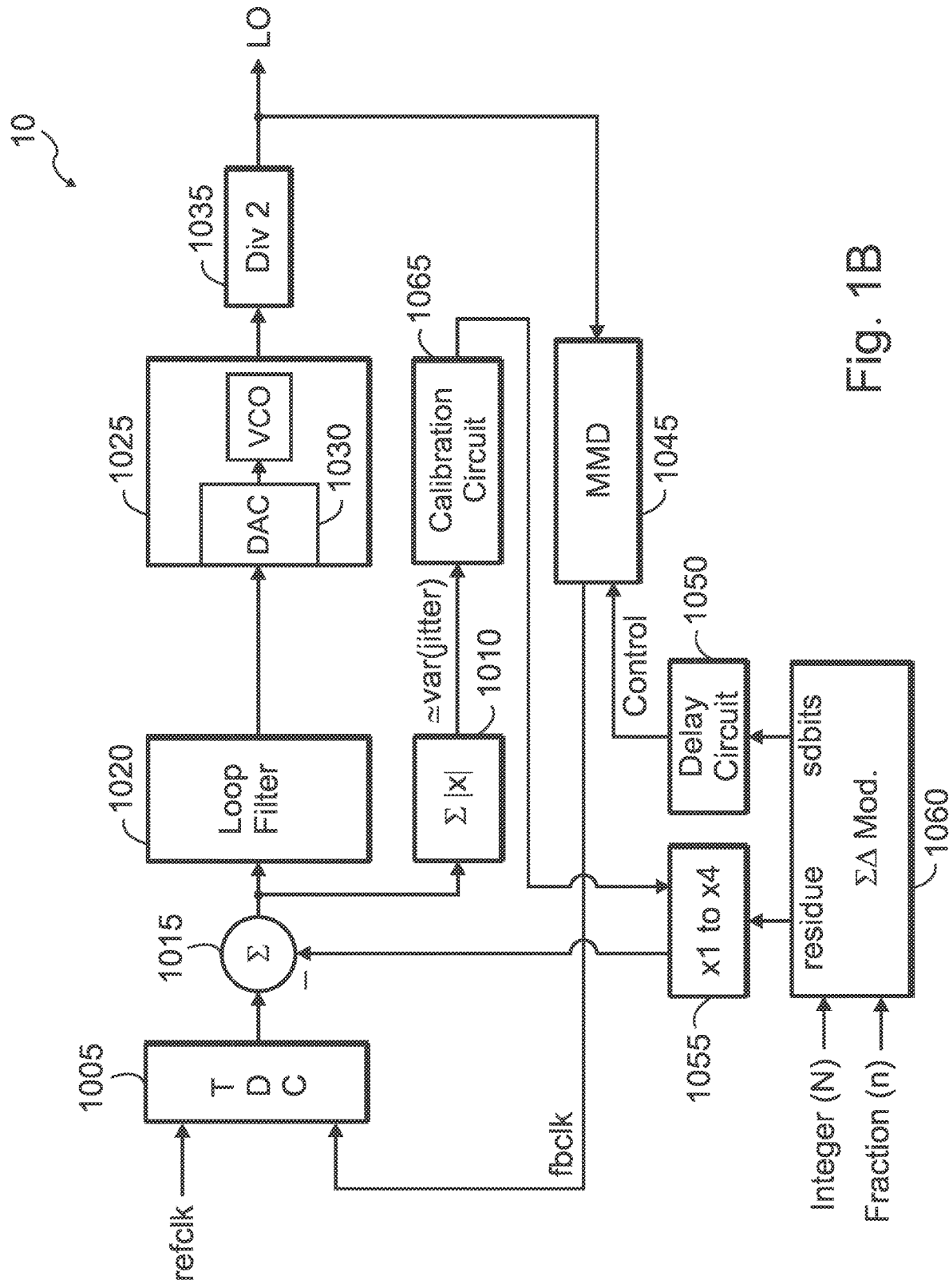

FIG. 1B shows a circuit arrangement for a DFS 10 according to another exemplary embodiment. DFS 10 in FIG. 1B is similar to DFS 10 in FIG. 1A, but uses a different technique for residue cancellation. More specifically, referring again to FIG. 1B, the output of residue error circuit 1010 is provided to calibration circuit 1065. Calibration circuit 1065 uses the output of residue error circuit 1010 (roughly the variance of the jitter) to select a scale or gain for scaling circuit 1055 so as to cause residue cancellation (reduce or cancel or eliminate the effect of the residue on DFS 10). In some embodiments, calibration circuit 1065 may use information or data included or contained in firmware, such as information determined during design, manufacture, test, and/or operation of DFS 10 or a device (e.g., an IC) that includes DFS 10. Such information or data is subsequently used during operation of DFS 10 for residue cancellation.

Figure 2:
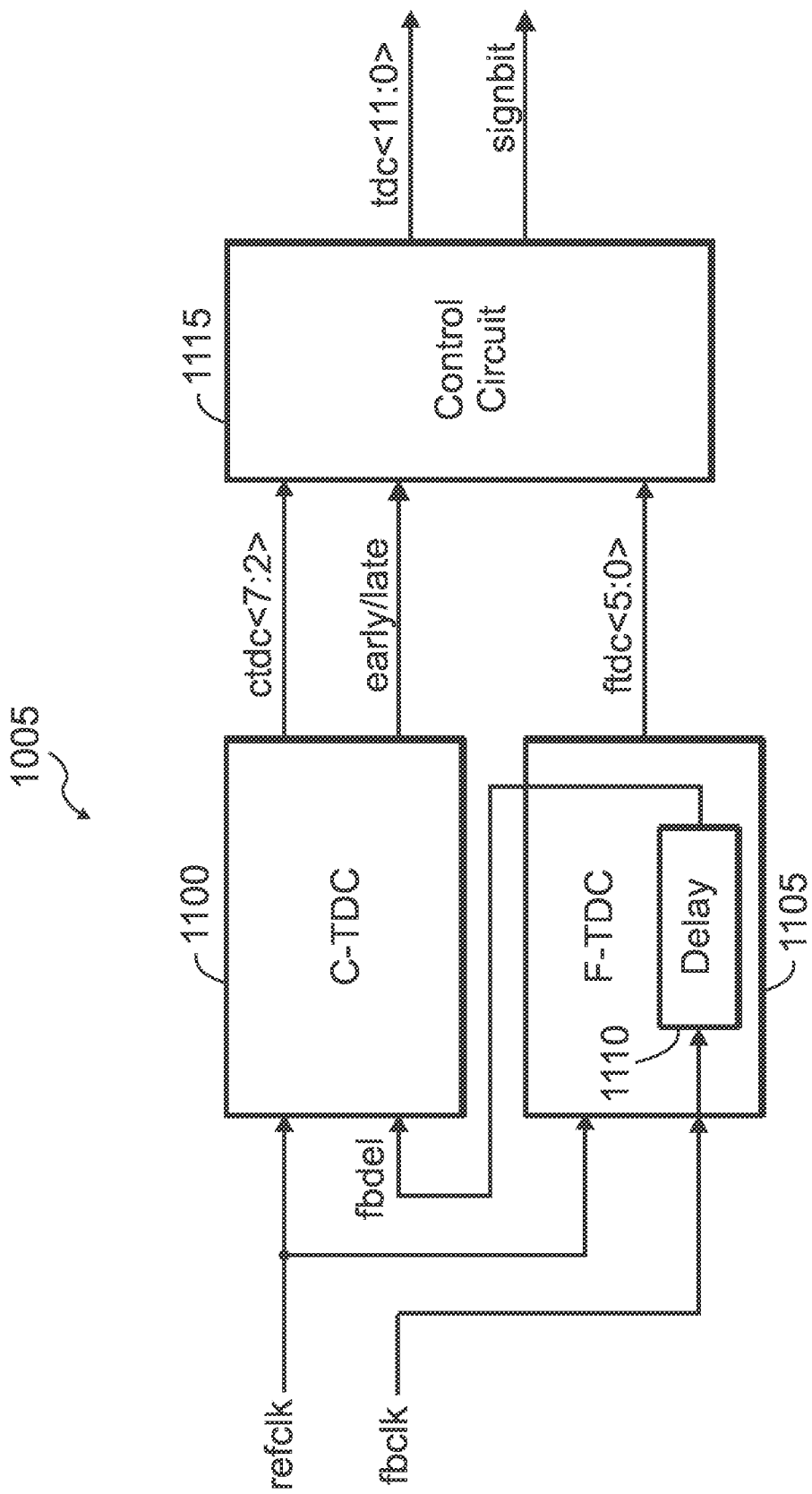
FIG. 2 shows a circuit arrangement for a TDC according to an exemplary embodiment.

FIG. 2 shows a circuit arrangement for TDC 1005 according to an exemplary embodiment. TDC 1005 includes C-TDC 1100 and F-TDC 1105 which, together, cover the entire 2π range of phase error values. C-TDC 1100 covers a range over entire cycles of the reference clock, refclk. F-TDC 1105 implements a range centered around the lock position, such as SDM 1060's quantized jitter remains within the range. The signal refclk drives an input of C-TDC 1100. A signal fbdel from delay circuit 1110 in F-TDC 1105 drives another input of C-TDC 1100. The delay generated by delay circuit 1110 is one half of the range of values of the output of F-TDC 1105. The output of C-TDC 1100 includes a signal ctdc (having bits 2 through 7 in the example shown, although other values can be used as desired), and an early/late signal. Both output signals of C-TDC 1100 are provided to control circuit 1115.

The signal refclk also drives an input of F-TDC 1105. The signal fbclk (see FIG. 1A or 1B) drives delay circuit 1110. A delayed version of signal fbclk is provided as signal fbdel, as noted above. The output of F-TDC 1105 includes a signal ftdc (having bits 0 through 5 in the example shown, although other values can be used as desired), which is provided to control circuit 1115. Using signals ctdc and ftdc and the early/late signal, control circuit 1115 generates the output signals of TDC 1005, which include a tdc signal and a sign bit signal, i.e., signbit. The tdc signal has bits 0 through 11 in the example shown, although other values can be used as desired).

Figure 3:
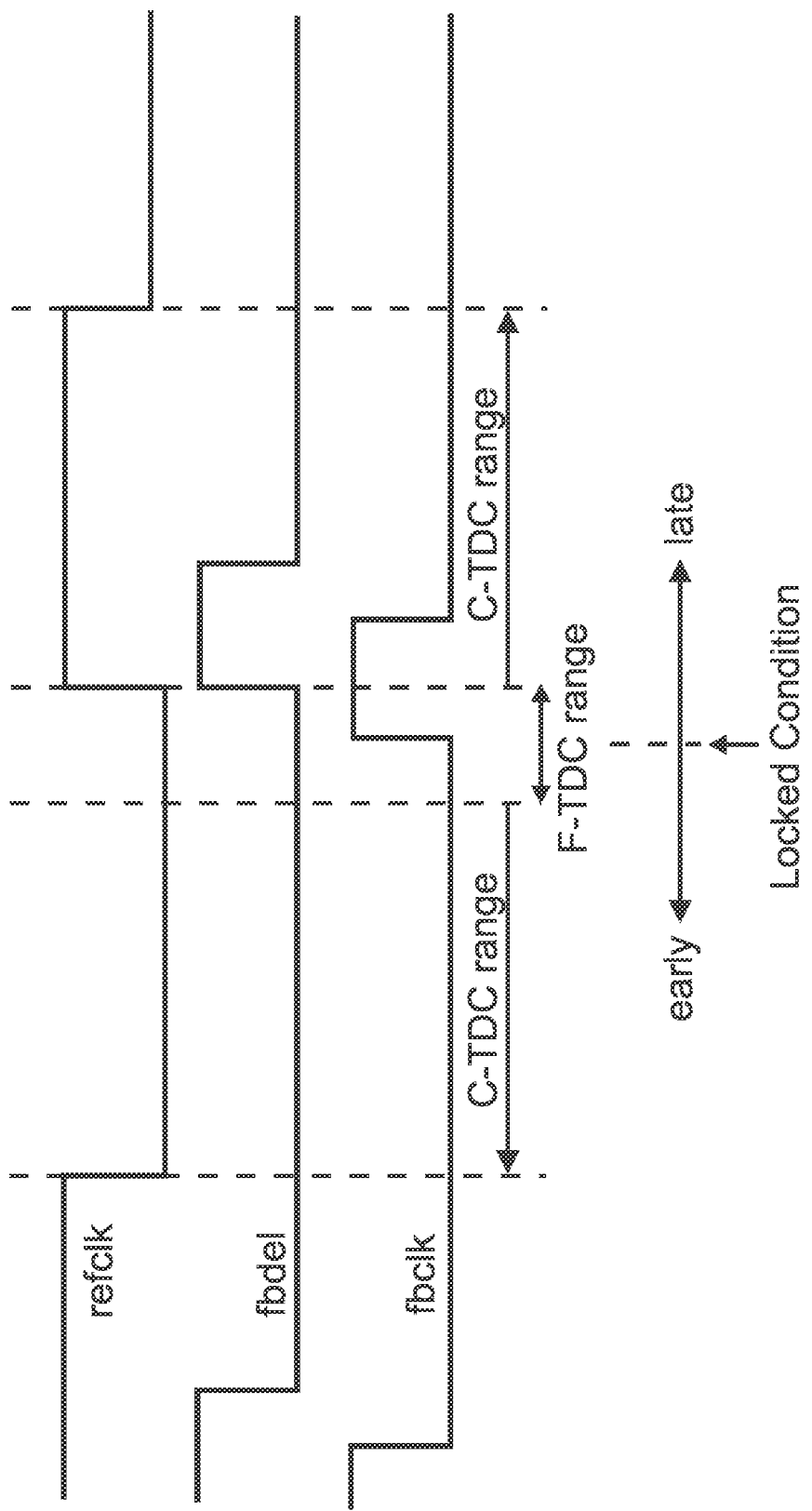
FIG. 3 shows a timing diagram for a TDC according to an exemplary embodiment.

The operation of control circuit 1115 may be better understood by reference to FIG. 3, which shows a timing diagram for a TDC according to an exemplary embodiment. More specifically, the diagram shows the ranges of the C-TDC and F-TDC output signals as they relate to the refclk, fbdel, and fbclk signals. The range of values corresponding to early and late are also indicated. The locked condition (or the ideal condition) is indicated at the boundary between the early and late ranges.

Thus, FIG. 3 illustrates that the C-TDC causes a number of phase steps in the range indicated as "C-TDC range" to bring the frequency of the fbclk signal closer to the frequency of the refclk. The F-TDC causes a number of additional phase steps in the range indicated as "F-TDC range" to bring the frequency of the fbclk signal closer to the frequency of the refclk signal and eventually into phase lock. Note that the "C-TDC range" straddles the "F-TDC range." In other words, the "C-TDC range" is divided into two ranges, one range that is below or before or preceding the "F-TDC range" and another range that is above or after or succeeding the "F-TDC range." Furthermore, note that in various embodiments the C-TDC phase step or steps (phase step(s) taken by C-TDC 1100) are larger than the F-TDC phase steps or steps (phase step(s) taken by C-TDC 1105), hence the labels "coarse" TDC (C-TDC) and "fine" TDC (F-TDC), respectively. In some embodiments, the ratio of the C-TDC phase step(s) to the F-TDC phase step(s) is an integer. In some embodiments, the ratio of the C-TDC phase step(s) to the F-TDC phase step(s) is non-integer.

Figure 4:
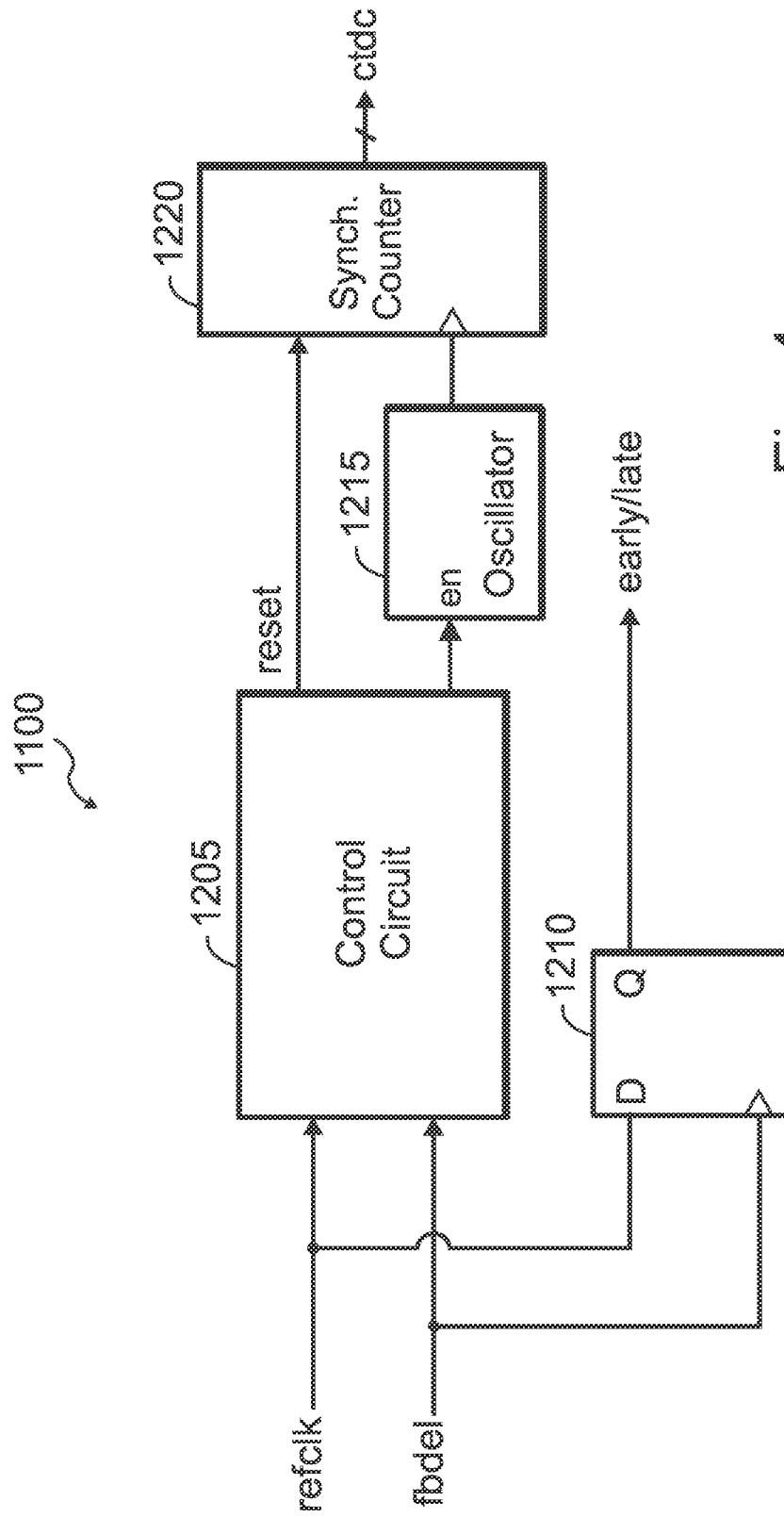
FIG. 4 shows a circuit arrangement for a coarse TDC (C-TDC or CTDC) according to an exemplary embodiment.

FIG. 4 shows a circuit arrangement for C-TDC 1100 according to an exemplary embodiment. The refclk and fbdel signals drive the D and clock inputs of D-type flip-flop 1210. The output of flip-flop 1210 constitutes the early/late signal, described above (a binary logic value of 0 indicates that the fbdel signal is early, whereas a binary logic value of 1 indicates that the fbdel signal is late). The refclk and fbdel signals also drive the inputs of control circuit 1205. In response, control circuit 1205 generates a reset signal, which is used to reset synchronous counter 1220 to an initial count value. Control circuit 1205 also generates an enable signal for oscillator 1215. In response to the enable signal (i.e., when the enable signal is asserted), oscillator 1215 provides clock signals to synchronous counter 1220.

More specifically, control circuit 1205 enables oscillator 1215 at the rising edge occurrence of refclk (or fbdel). Control circuit 1205 halts (de-asserts the enable signal) oscillator 1215 at the rising edge of fbdel (or refclk). The output of synchronous counter 1220 constitutes the ctdc signal, along with the early/late signal.

Figure 5A:
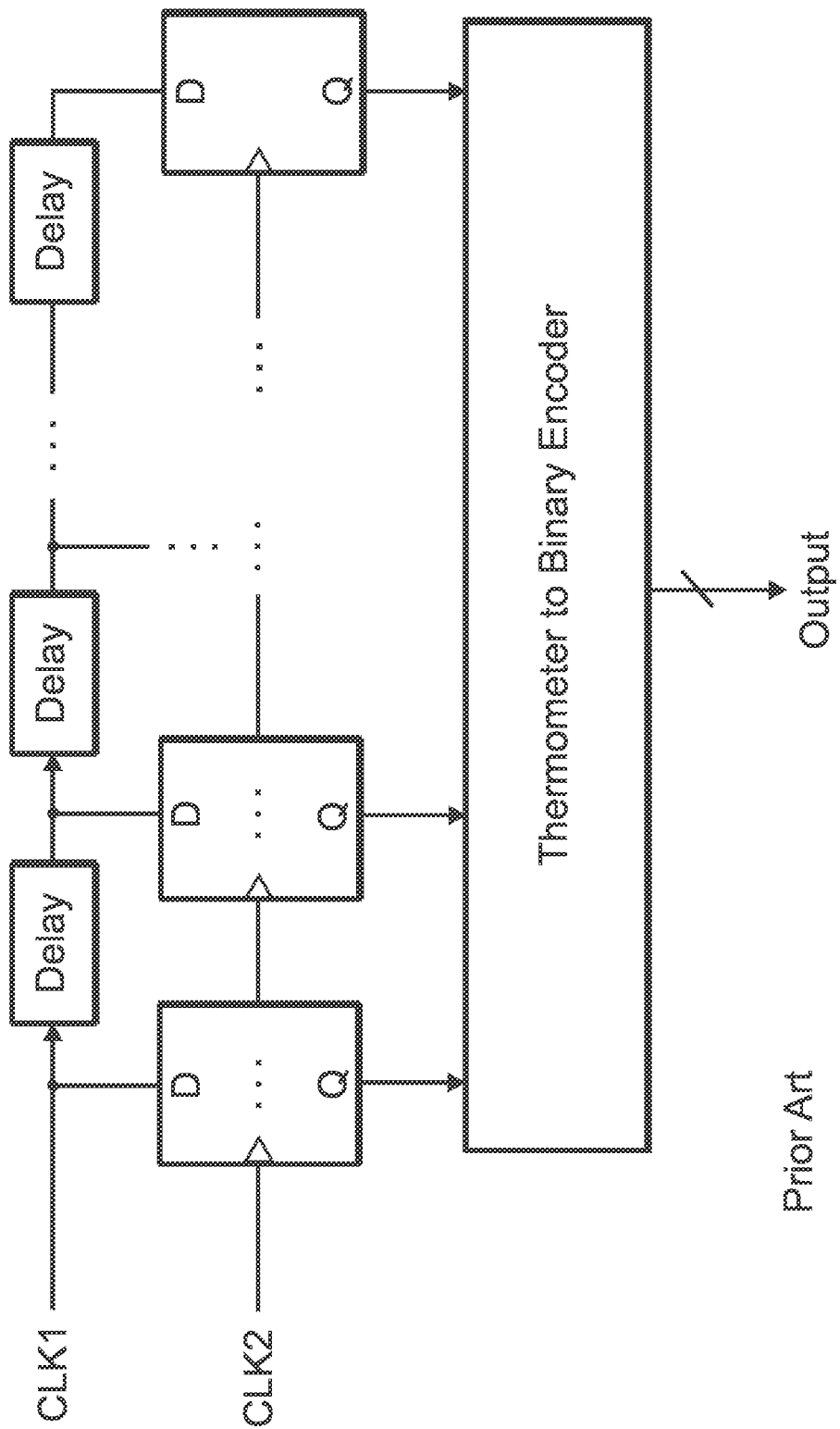
FIG. 5A shows a circuit arrangement for a conventional TDC.

FIG. 5A shows a circuit arrangement for a conventional TDC. The TDC includes a chain of delay circuits fed by an input signal (e.g., fbclk), a chain of flip-flops fed by a clock signal (e.g., refclk), and a thermometer to binary encoder. The operation of the circuit is known to persons of ordinary skill in the art. In the conventional approach to implementing the TDC shown in FIG. 5A, the phase difference (or time difference) between two clock signals can be measured and quantized to a discrete value by passing one clock signal (CLK1) through a delay line and using the second clock signal (CLK2) to control the sampling action of the flip-flops. In essence, the transition in the second clock signal takes a snapshot of the delay element outputs and locates how far into the delay line the first clock signal has propagated. This position can then be encoded into a binary output that represents the relative time delay between the two clock signals. If a relatively large delay range is desired, the straightforward approach is simply to cascade more delay stages and add more flip-flops. Doing so, however, increases the chip area, entails driving more flip-flops by the second clock signal with corresponding extra capacitive loading increased power consumption, and more complicated clock skew management as the second clock signal is distributed to more flip-flops.

Figure 5B:
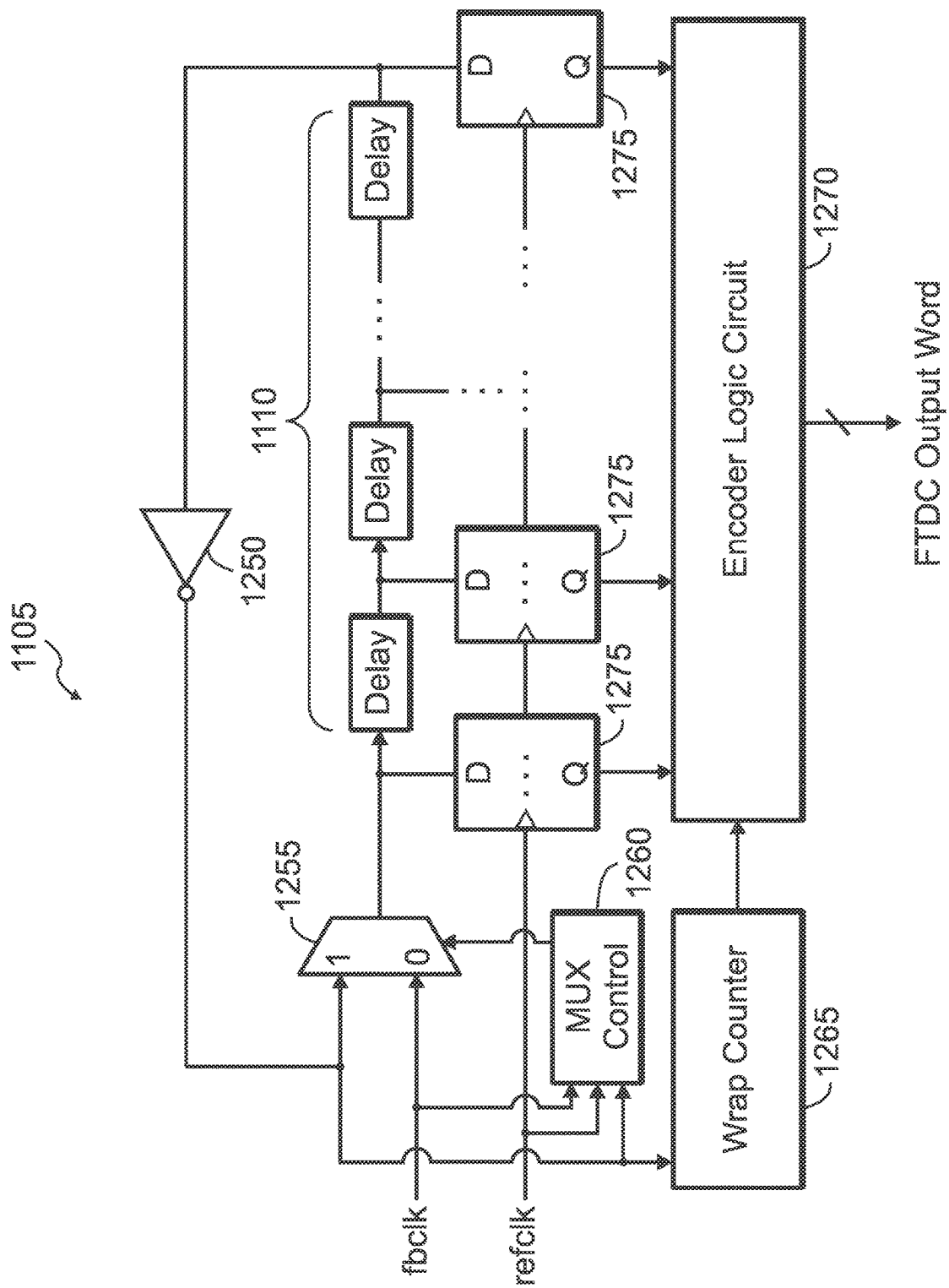
FIG. 5B shows a circuit arrangement for a fine TDC (F-TDC or FTDC) according to an exemplary embodiment.

Instead of extending the length of the delay line and associated flip-flops, one can create a re-circulating delay line and associated flip-flops. Conceptually, when the first clock transition occurs, it is launched into a first delay element in a delay circuit or delay line that includes a number of delay cells or elements. The first clock signal propagates through the delay line and when it reaches the last delay element, an inverted version of the output signal of the last delay element is fed into the first delay element and, simultaneously, a wrap counter records that one round trip has occurred through the delay elements. The first clock signal continues to propagate and wrap around the delay line until the second clock simultaneously samples the wrap count value and all the states of the delay elements. An encoder circuit then combines the flip-flop samples and produces a binary output. FIG. 5B shows one implementation of this concept, as described below in detail.

More specifically, a single-ended embodiment of a re-circulating F-TDC is shown in FIG. 5B. Initially, a multiplexer (MUX) is set to one position, say, position "0," and the first clock signal (e.g., fbclk) transition enters the first delay cell. When the first clock signal reaches the last delay cell, the output signal of that delay cell signal is inverted, and the MUX is automatically reconfigured to select the re-circulated signal with another position, say, position "1." The MUX stays in this position until a second clock signal (e.g., refclk) samples the outputs of the delay cells and the wrap counter. After sampling is completed, a reset signal clears the wrap counter, sets the MUX to position "0," and sets all delay elements to their reset level (e.g., "0").

Referring to FIG. 5B, reference signal refclk drives the clock inputs of D-type flip-flops 1275, which are coupled in a cascade fashion or chain. The outputs of flip-flops 1275 are provided to encoder logic circuit 1270. The output of encoder logic circuit 1270 constitutes the output of F-TDC 1105, i.e., the ftdc signal (see FIG. 2).

Referring again to FIG. 5B, the D inputs of flip-flops 1275 are driven by the output signal of MUX 1255, and delayed versions of that signal. More specifically, the output signal of MUX 1255 is provided to the D input of the first flip-flop 1275. The outputs of a set of delay circuits, coupled in a cascade or chain fashion, drive the respective D inputs of the remaining flip-flops 1275. The output of the last delay circuit 1110 drives an input of inverter 1250. The output of inverter 1250 drives one input of MUX 1255, and also a clock input of wrap counter 1265. In response, wrap counter 1265 counts the number of times a signal has propagated through delay circuits 1110. The output of wrap counter 1265 is provided to encoder logic circuit 1270. Encoder logic circuit 1270 combines the wrap count value (output of wrap counter 1265) with the states (Q outputs) of flip-flops 1275 to form a signed binary output word. The states of flip-flops 1275 are thermometer-to-binary encoded by encoder logic circuit 1270 if the wrap count is even. If the wrap count is odd, however, then the states of flip-flops 1275 are inverted in encoder logic circuit 1270 prior to the thermometer-to-binary conversion in encoder logic circuit 1270.

The signal fbclk drives a second input of MUX 1255. The select signal of MUX 1255 is provided by MUX control circuit 1260. If the select signal of MUX 1255 has a binary logic 0 value, signal fbclk is provided as the output signal of MUX 1255. Conversely, if the select signal has a binary logic 1 value, the output signal of inverter 1250 is provided as the output signal of MUX 1255. MUX control circuit 1260 generates the select signal using the fbclk signal, the refclk signal, and the output signal of inverter 1250.

In exemplary embodiments, such as the embodiment shown in FIG. 5B, F-TDC 1105 is of a re-circulating type or operates in a re-circulating manner. The re-circulating operation of F-TDC 1105, including the operation of MUX control circuit 1260, occurs as follows: Initially, F-TDC 1105 is reset with the falling edge of refclk, and MUX 1255 provides the fbclk signal as the output signal (i.e., the select signal has a binary logic 0 value). Initially, the fbclk clock signal propagates through the delay blocks in delay circuit 1110 (all delay line outputs sequentially change from 0 to 1). When the signal reaches the last delay block, the following occurs: (a) inverter 1250 provides binary logic 0 to MUX 1255; (b) wrap counter 1265 increments to indicate that one trip through delay circuit 1110 has occurred; and (c) MUX 1255 switches to position 1 (provides the output signal of inverter 1250), and remains in that position until F-TDC 1105 is reset. The output of MUX 1255 then propagates a binary logic zero through delay circuit 1110. If a second wrap condition occurs, then wrap counter 1265 increments, and MUX 1255 propagates a binary logic 1 value through delay circuit 1110. Further wrapping causes wrap counter 1265 to increment, and binary logic values of 1 and 0 alternately propagate through delay circuit 1110.

On the rising edge of refclk, all of flip-flops 1275 and the output value of wrap counter 1265 are sampled. Encoder logic circuit 1270 encodes the output value (or count) of wrap counter 1265 and the output signals of flip-flops 1275, and produces a binary word that represents the time (or phase difference) between the two clock edges (fbclk and refclk). On the falling edge of refclk, the entire circuitry in F-TDC 1105 is reset, and the process continues as described above.

Figure 6:
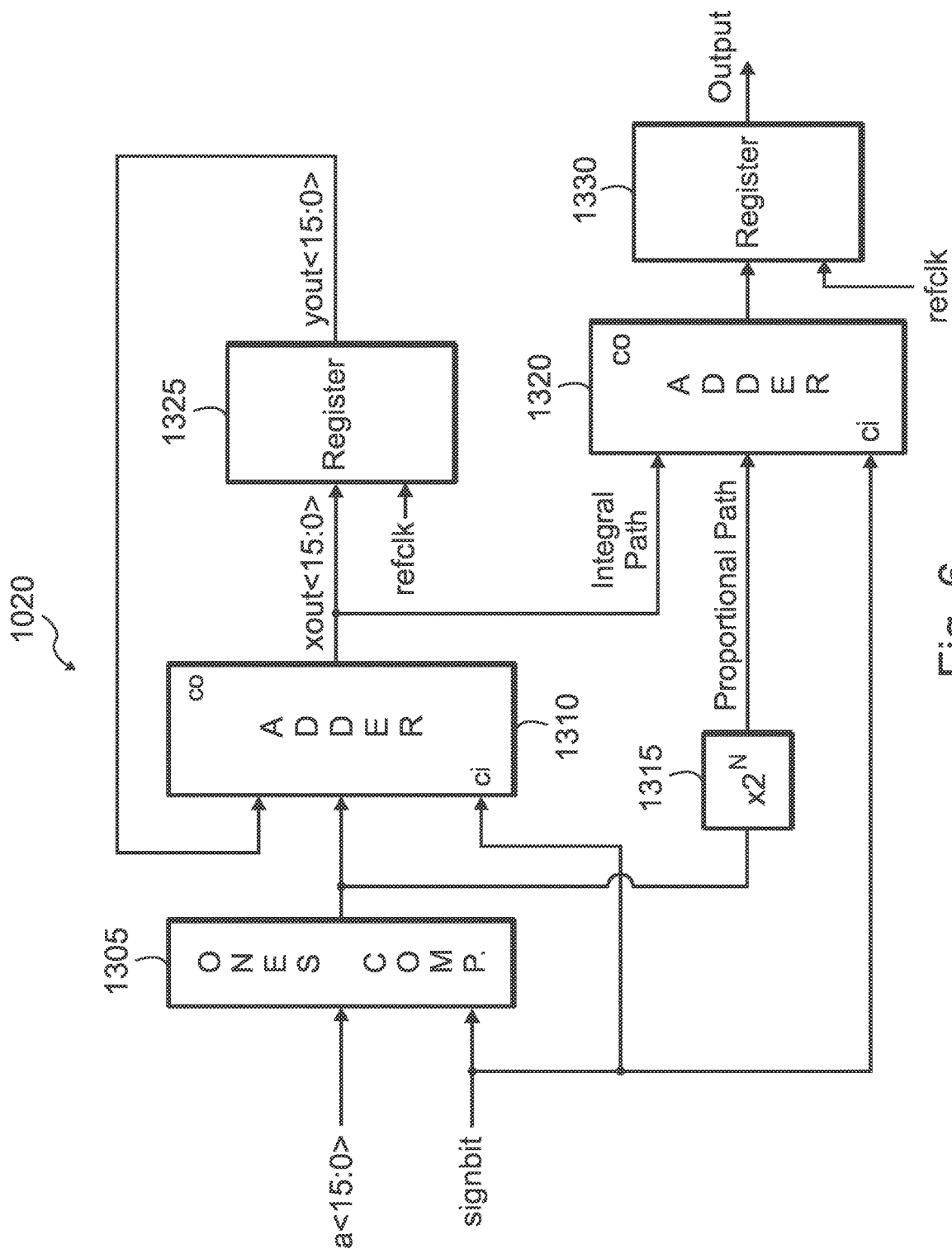
FIG. 6 shows a circuit arrangement for a digital loop filter according to an exemplary embodiment.

FIG. 6 shows a circuit arrangement for digital loop filter 1020 according to an exemplary embodiment. The input signal to loop filter 1020 consists of a signal "a" (which has bits 0 through 15, i.e., a 16-bit signal, although other values may be used, as desired), and the signbit signal (i.e., a signal that indicates the sign of the "a" signal), for instance, as provided by TDC 1005 (see FIG. 2). Referring again to FIG. 6, the signal "a" and the "signbit" signal are provided to a one's complement circuit 1305. The output of one's complement circuit 1305 drives a first input of adder 1310, while the signbit signal constitutes the carry-in (ci) input of adder 1310. An output of register 1325, i.e., signal yout (which, in the example shown, as bits 0 through 15, although other sizes or values may be used, as desired) drives a second input of adder 1310.

The sum of the inputs to adder 1310 is provided as signal xout which, in the example shown, has bits 0 through 15, although other sizes or values may be used, as desired. Signal xout drives the input of register 1325, and signal refclk clocks register 1325. The output of one's complement circuit 1305 is scaled by scaling circuit 1315, which scales the signal by $2^N$. The output signal of scaling circuit 1315 constitutes the proportional path signal, and is provided to adder 1320. The signbit signal is provided as carry-in (ci) to adder 1320. The signal xout (output of adder 1310) constitutes the integral path signal, and is also provided to adder 1320. The sum output of adder 1320 drives the input of register 1330, which is clocked by signal refclk. The output of register 1330 constitutes a digital control signal that is used to control DCO 1025 (see FIG. 1A or 1B).

Referring again to FIG. 6, a control circuit (not shown) detects overflow and underflow situations, and properly sets the output of register 1330, as appropriate. More specifically, if the carry out signal for adder 1320 has a logic 1 signal and the carry in signal for adder 1320 has a binary logic 0 value, an overflow condition exists. Accordingly, the output of register 1330 is set to all ones (0xFFFF for the example shown). Conversely, if the carry in of adder 1320 has a binary logic 1 value, the previous most-significant bit (MSB) of the output of adder 1320 has a binary 0 logic value, and the new MSB of the output of adder 1320 has a binary logic value of 1, then an underflow condition (negative number) is detected. Accordingly, the output of register 1330 is set to all zeros (0x0000 for the example shown).

Figure 7:
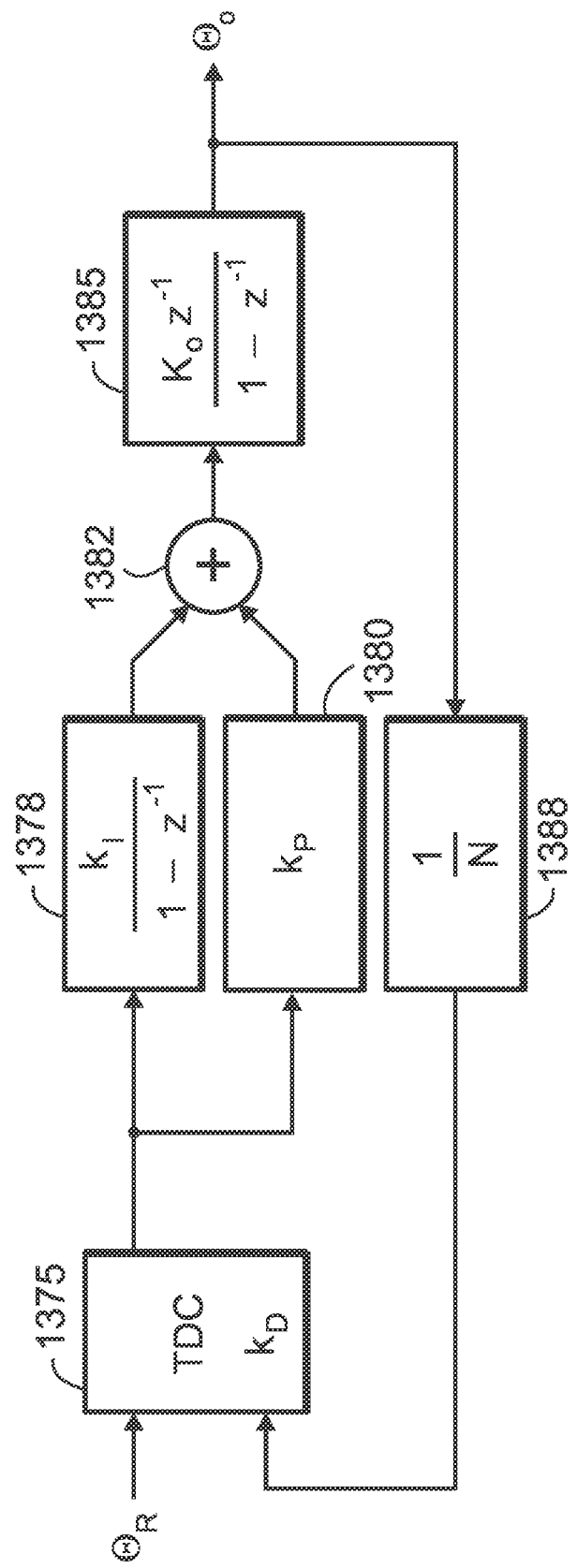
FIG. 7 shows a diagram of transfer functions of various circuit blocks of a DFS according to an exemplary embodiment.

FIG. 7 shows a diagram of transfer functions of various circuit blocks of a DFS according to an exemplary embodiment. The transfer functions may be used to derive an overall transfer function for DFS 10. In the exemplary embodiment shown, block 1375 represents the transfer function of TDC 1005, block 1378 represents the integral path of the loop filter (digital loop filter 1020 in FIG. 1), block 1380 represents the proportional path of the loop filter, block 1382 represents a summer or adder, block 1385 represents the VCO or DCO, and block 1388 represents the feedback-path circuitry. Using the transfer functions shown, the overall transfer function may be represented as:

$$\frac{\Theta_O}{\Theta_R} = \frac{k_P k_D K_O z^{-1} \left[\left(1 + \frac{k_I}{k_P}\right) - z^{-1}\right]}{1 + \left[\frac{(k_I + k_P)k_D K_O}{N} - 2\right]z^{-1} + \left[1 - \frac{k_P k_D K_O}{N}\right]z^{-2}}$$

where $$K_O = 2\pi K_{vco} T_{ref}$$

and $$k_D = \frac{1}{2\pi} \frac{T_{ref}}{\Delta_{TDC}}$$

and where $K_{vco}$ represents the DCO gain, $K_o$ represents the DCO phase change, $k_D$ represents the TDC gain, $k_P$ represents the proportional path gain, $k_I$ represents the integral path gain, $T_{ref}$ represents the period of the reference clock signal, refclk (e.g., 26 ns in the BLE example), and $\Delta_{TDC}$ is the nominal phase step size of the F-TDC 1105 (e.g., 22 ps in the BLE example).

Figure 8:
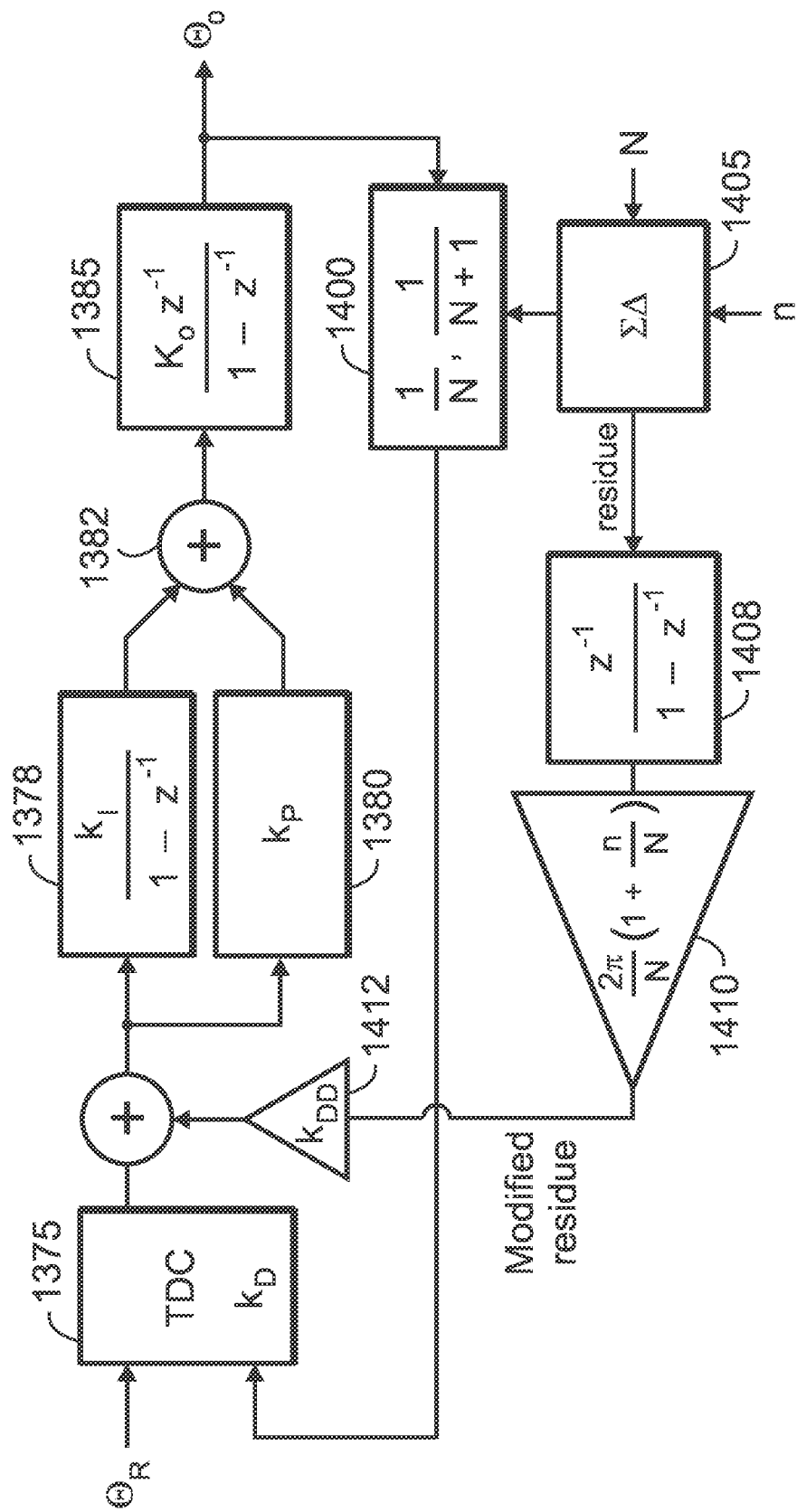
FIG. 8 shows a diagram of transfer functions of various circuit blocks of a DFS according to another exemplary embodiment.

FIG. 8 shows a diagram of transfer functions of various circuit blocks of a DFS according to another exemplary embodiment. More specifically, the figure shows the transfer functions of various blocks in a DFS that includes a SDM and residue cancellation (e.g., as shown in FIG. 1A or 1B). Referring again to FIG. 8, some of the blocks are the same as in FIG. 7, i.e., 1375, 1378, 1380, 1382, and 1385. Block 1400 represents the MMD, block 1405 represents the SDM, and blocks 1408 and 1410 represent the processing of the SDM error output to produce the residue. The residue is scaled by block 1412. Note that the LMS adaptation technique, which adapts the $k_{DD}$ gain to compensate for the TDC gain variation with process and temperature, is not shown in this diagram to facilitate presentation. Blocks 1405, 1408, and 1410 correspond to SDM 1060 and delay circuit 1050 in FIGS. 1A and 1B. Using the transfer functions shown in FIG. 8, the overall transfer function may be represented as:

$$\frac{\Theta_O}{\Theta_R} = \frac{k_P k_D K_O z^{-1} \left[\left(1 + \frac{k_I}{k_P}\right) - z^{-1}\right]}{1 + \left[\frac{(k_I + k_P)k_D K_O}{N} - 2\right]z^{-1} + \left[1 - \frac{k_P k_D K_O}{N}\right]z^{-2}}$$

Assuming $k_I$=1; $k_P$=32, 64, and 128; and refclk frequency of 38.4 MHz (e.g., an implementation of a DFS for a Bluetooth Low-Energy (BLE) application), the VCO or DCO frequency range (2·N·refclk) has a range of 4200-5700 MHz, which implies N values of 54-74. Using those values, and assuming $K_{VCO}$ is about 5 kHz/LSB, and given the above formula for $k_D$, a TDC step size of 22.2 ps should be used.

Figure 9:
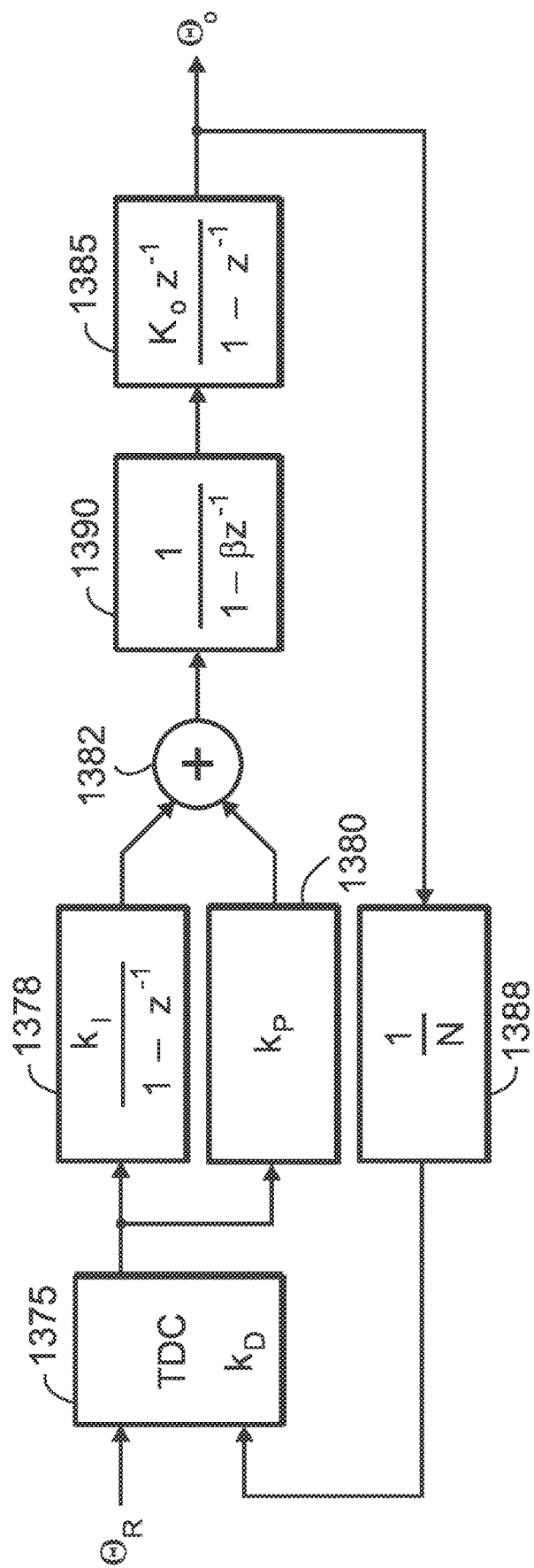
FIG. 9 shows a diagram of transfer functions of various circuit blocks of a DFS according to another exemplary embodiment.

FIG. 9 shows a diagram of transfer functions of various circuit blocks of a DFS according to another exemplary embodiment. The DFS in this example uses a third-order PLL, as indicated by the addition of block 1390 (compare FIGS. 7 and 9). Block 1390 is a first-order low-pass filter that is used to reduce the high-frequency ripple from the output of summing block 1382 to lower the resulting phase noise and spurs at the DCO output, i.e., block 1385. The parameter β is varied to change the corner frequency of the low-pass filter, i.e., block 1390. In FIG. 9, block 1378 implements the integral path, block 1380 implements the proportional path, and the two are combined with by summing block 1382. Blocks 1378, 1380, 1382, and 1390 as a group are represented as the loop filter, i.e., digital loop filter 1020 in FIGS. 1A and 1B. Using the transfer functions shown, the overall transfer function may be represented as:

$$\frac{\Theta_O}{\Theta_R} = \frac{k_P k_D K_O z^{-1} \left[\left(1 + \frac{k_I}{k_P}\right) - z^{-1}\right]}{1 + \left[-\beta - 2 + \frac{k_P k_D K_o}{N}\left(1 + \frac{k_I}{k_D}\right)\right]z^{-1} + \left[1 + 2\beta - \frac{k_P k_D K_o}{N}\right]z^{-2} - \beta z^{-3}}$$

In exemplary embodiments, second-order or third-order SDMs may be used, which may have 2, 3, 4, or other values of the number of output levels. As persons of ordinary skill in the art will understand, a number of trade-offs are made in the selection of the design and performance parameters of SDM 1060 in FIGS. 1A and 1B. The choice of such parameters and the resulting circuitry for a given implementation depends on a variety of factors, as persons of ordinary skill in the art will understand. Such factors include design specifications, performance specifications, cost, IC or device area, available technology, such as semiconductor fabrication technology, target markets, target end-users, etc.

For example, using a third-order SDM results in lower quantization noise below 6.7 MHz (e.g., using the BLE example above), but digital loop filter 1020 would use an extra pole in its transfer function to reject higher-frequency levels of quantization noise. Using a second-order SDM, on the other hand, would allow for a simpler and wider bandwidth digital loop filter 1020. With respect to output levels, a higher number of output levels, say, 4, would accommodate relatively large dither rejection from SDM 1060. Using a lower number, say, 2, on the other hand, would reduce the range of FTDC 1105 (see FIG. 2), which results in reduced power consumption, reduced circuit area/size, and reduced accumulated jitter.

As an illustration, and merely by way of example, for an embodiment that accommodates the BLE parameters and specifications, a second-order SDM 1060 with a 1-bit output may be used. Such a choice would accommodate relatively high bandwidth for transmit modulation, would reduce or minimize toggling steps of MMD 1045 (see FIG. 1A or 1B), and would reduce or minimize the range of FTDC 1105 (as opposed to multi-bit SDMs). Such an SDM would have three modes, depending on the values of n (the fractional divide parameter of the DFS). The three modes are as follows:

Mode 0: 0.25<n<0.75
Mode 1: n≤0.25
Mode 2: n≥0.75

Figure 12:
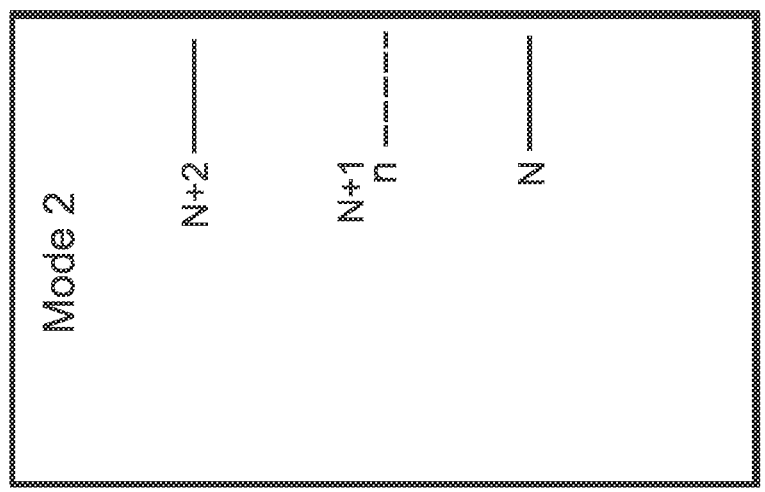
FIG. 12 shows a diagram pertaining to another mode of operation of an SDM according to an exemplary embodiment.
Figure 11:
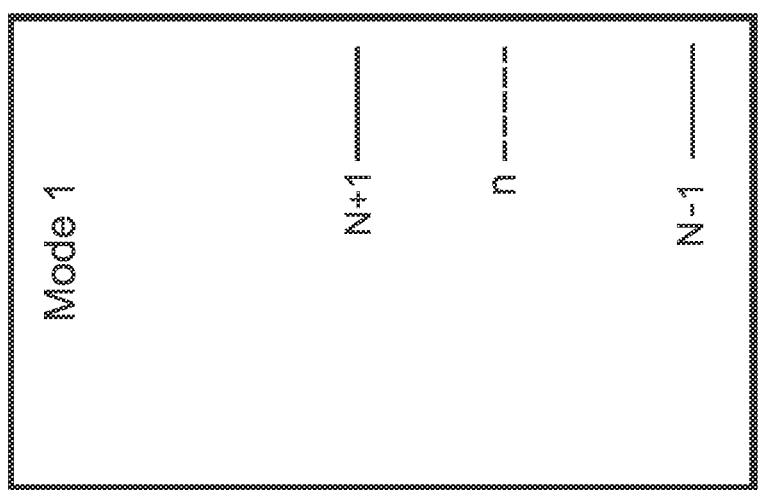
FIG. 11 shows a diagram pertaining to another mode of operation of an SDM according to an exemplary embodiment.
Figure 10:
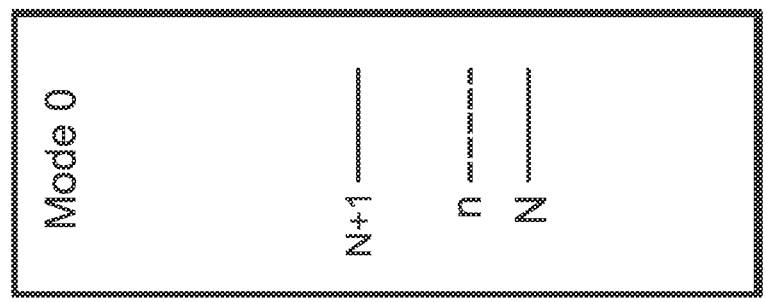
FIG. 10 shows a diagram pertaining to a first mode of operation of a sigma-delta modulator (SDM) according to an exemplary embodiment.

Using the above modes keeps the fractional part (n) relatively close to the 50% level in order to reduce or minimize spurs and tonal outputs in the output signal (sdbits in FIG. 1A or 1B) of SDM 1060. FIG. 10 shows operation in Mode 0. In this mode, output signal sdbits of SDM 1060 toggle between the values N and N+1. FIG. 11 shows operation in Mode 1. In this mode, output signal sdbits of SDM 1060 toggle between the values N−1 and N+1. FIG. 12 shows operation in Mode 2. In this mode, output signal sdbits of SDM 1060 toggle between the values N and N+2.

Figure 13:
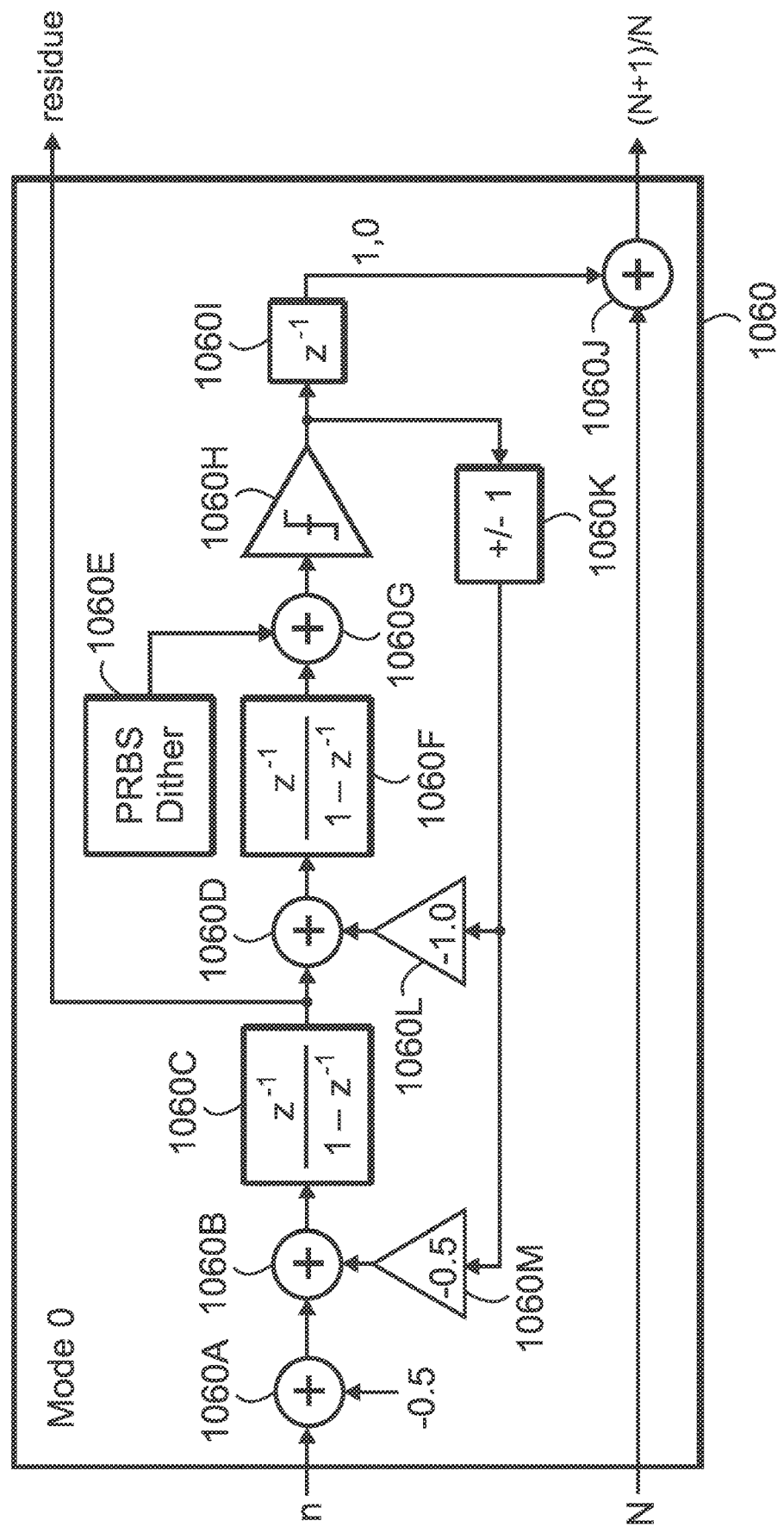
FIG. 13 shows a circuit arrangement for the first mode of operation of an SDM according to an exemplary embodiment.

In order to implement modes 0, 1, and 2, some changes are made to the circuitry and/or operating parameters of SDM 1060. FIG. 13 shows a circuit arrangement for an SDM 1060, operating in mode 0, according to an exemplary embodiment. As noted above, SDM 1060 receives the values of n and N as input signals. The fractional value (n) is provided to adder 1060A, which receives at a second input the constant −0.5. The sum at the output of adder 1060A drives an input of adder 1060B, while a second input of adder 1060B receives the output of 1-bit digital-to-digital converter (DDC) 1060K, multiplied by −0.5 by scaling circuit 1060M. DDC 1060K generates at its output the value of +1 or −1, depending on the value of its input signal.

The sum at the output of adder 1060B drives the input of integrator 1060C. The output of integrator 1060C constitutes the residue output of SDM 1060, and is also provided to adder 1060D. The output of DDC 1060K, multiplied by −1.0 by scaling circuit 1060L, drives another input of adder 1060D. The sum at the output adder 1060D drives the input of integrator 1060F, the output of which drives one input of adder 1060G. Another input of adder 1060G is driven by the output of pseudo-random binary sequence (PRBS) dither circuit 1060E (used to break up periodic cycles or limit cycles in SDM 1060 to eliminate or reduce spurs or make the input signal of quantizer 1060H appear more noise-like), as persons of ordinary skill in the art will understand).

The sum at the output of adder 1060G drives the input of quantizer 1060H (implemented, for example, by using a comparator, as persons of ordinary skill in the art will understand). The output of quantizer 1060H is provided to DDC 1060K as an input signal. The sum at the output of adder 1060G is quantized to a single bit by quantizer 1060H and then provided to delay circuit 1060I. The delayed output of delay circuit 1060I drives one input of adder 1060J. The input value N drives a second input of adder 1060J. The sum at the output of adder 1060J is provided as the output of SDM 1060 and is used to drive MMD 1045. In the case shown, i.e., mode 0, the output toggles between N and N+1, as noted above.

Figure 14:
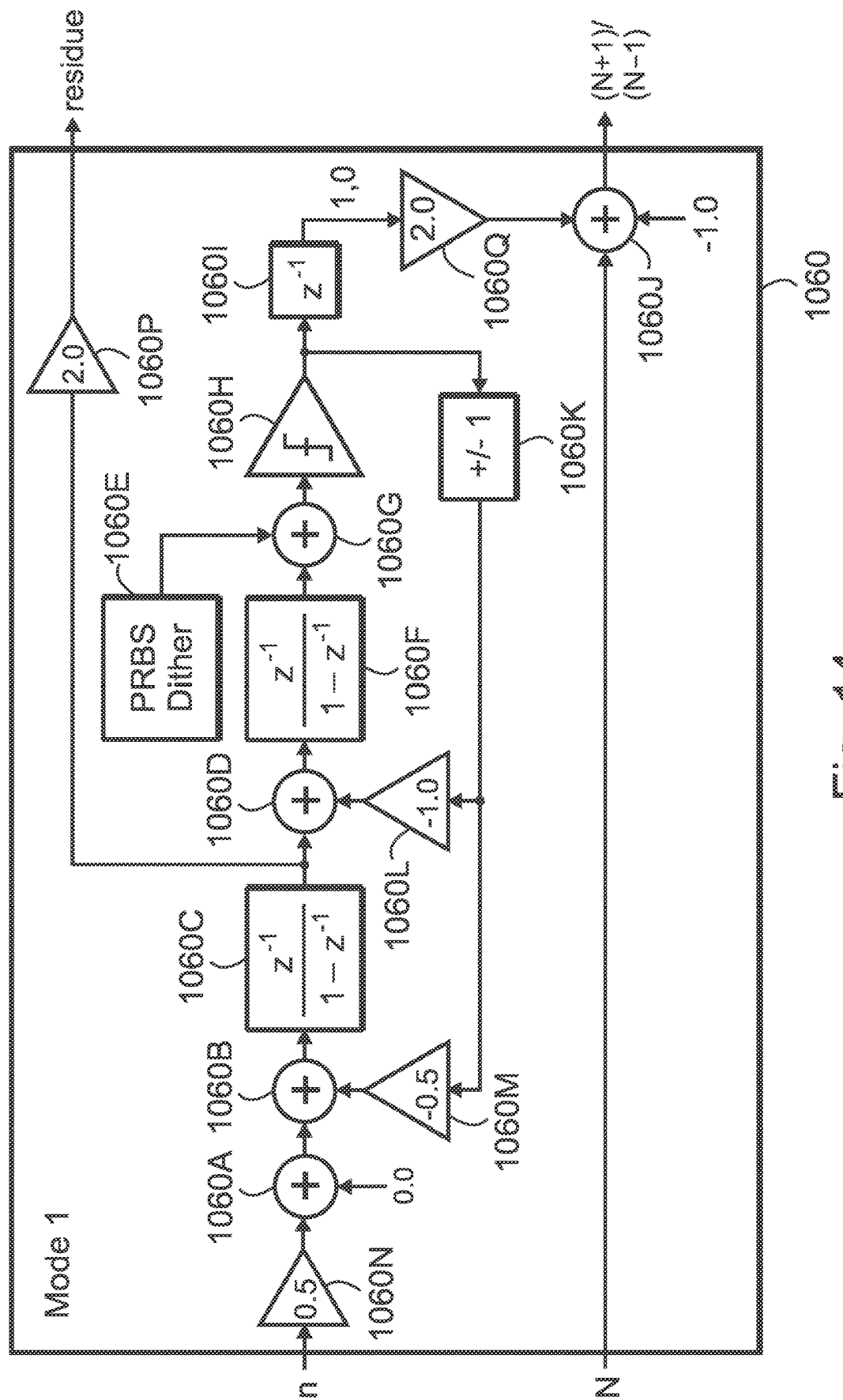
FIG. 14 shows a circuit arrangement for another mode of operation of an SDM according to an exemplary embodiment.

FIG. 14 shows a circuit arrangement for an SDM 1060, operating in mode 1, according to an exemplary embodiment. In this mode, a scaling circuit 1060N, with a gain of 0.5, is driven by input signal n, the output of which drives the input of adder 1060A. The second input of adder 1060A is driven by the value 0. In addition, a scaling circuit 1060P scales the output of integrator 1060C by 2.0, and the resulting scaled value is provided as the residue output. A scaling circuit 1060Q scales the output of delay circuit 1060I by 2.0 and provides the resulting value to adder 1060J. A third input of adder 1060J is provided the value of −1.0.

Figure 15:
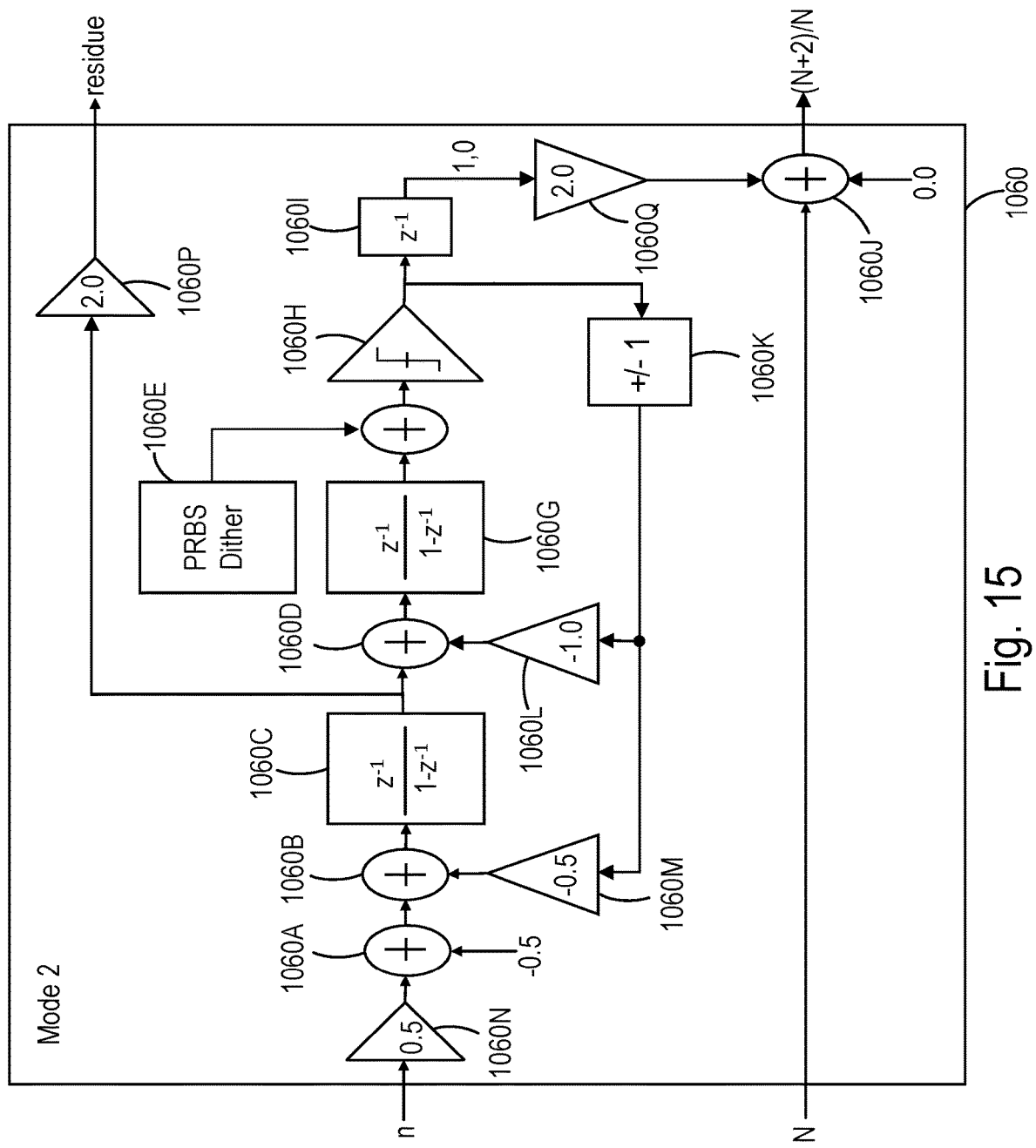
FIG. 15 shows a circuit arrangement for another mode of operation of an SDM according to an exemplary embodiment.

FIG. 15 shows a circuit arrangement for an SDM 1060, operating in mode 2, according to an exemplary embodiment. In this mode, scaling circuit 1060N has a gain of 0.5, as was the case with mode 1. The second input of adder 1060A, however, is driven by the value −0.5. Similar to mode 1, scaling circuit 1060P scales the output of integrator 1060C by 2.0, and the resulting scaled value is provided as the residue output. Also, similar to mode 1, scaling circuit 1060Q scales the output of delay circuit 1060I by 2.0 and provides the resulting value to adder 1060J. The third input of adder 1060J is provided the value of 0.

As noted above, one aspect of the disclosure relates to DCOs. In exemplary embodiments, a DAC is included in the DCO (see FIG. 1A or 1B) to program (or set or configure or adjust) the effective capacitance of the LC tank used in the VCO. FIG. 16 shows a circuit arrangement of a conventional LC oscillator 1600, which includes inductor L, capacitor C, and back-to-back inverters 1605 and 1610. Considering this simple LC tank oscillator in the context of the BLE example mentioned above, BLE modulation uses a frequency deviation of ±250 kHz, or about ±102 ppm. Assuming that 6 bits are used to control the value of capacitor C, a change in the value of the least-significant bit (LSB) would cause about a 7.8 kHz frequency change, i.e., about 3.2 ppm. A 3.2 ppm change in frequency means a ±6.4 ppm in capacitance. Assuming a nominal value of 1 pF for capacitor C, a ±6.4 ppm in capacitance implies a ±6.4 aF step, which is likely not feasible with current fabrication technologies.

DCOs according to exemplary embodiments use a different topology than do conventional VCOs (see FIG. 16). FIG. 17 shows a circuit arrangement of a single-ended DCO 1025 according to an exemplary embodiment (DAC 1030 is not shown). DCO 1025 includes capacitor C. In lieu of a simple inductor, however, DCO 1025 uses an inductor L coupled in series with capacitor $C_x$ to realize an effective inductance $L_{eff}$. In other words, the combination of inductor L and capacitor $C_x$ provides an effective inductance of $L_{eff}$ which, together with capacitor C, forms an LC tank. Inverter 1605 is back-to-back coupled to inverter 1610. Inverter 1605 and inverter 1610 are coupled in parallel with capacitor C and with the series-coupled inductor L and capacitor C.

By changing the values of capacitors C and $C_x$, the frequency of oscillation of the LC tank can be changed. As noted above, the topology shown offers relatively wide tuning range and relatively fine frequency steps which, together make reasonable sizes of DAC control words for capacitor C, feasible with realizable capacitor size selection. In DCO 1025, the value of $L_{eff}$ may be expressed as:

$$L_{eff} \approx L\left(1 - \frac{1}{\omega_o^2 L C_x}\right)$$

or $$L_{eff} \approx L\left(1 - \frac{C}{C_x}\right)$$

The step change in capacitor $C_x$ may be expressed as:

$$\Delta C_x = \frac{\Delta L_{eff}}{L_{eff}} \frac{C_x}{C}(C_x - C)$$

The step change in the output frequency is given by:

$$\frac{\Delta f}{f_0} = \frac{-1}{2} \frac{\Delta L_{eff}}{L_{eff}}$$

The step change in capacitor $C_x$ may therefore be expressed as:

$$\Delta C_x = -2\frac{\Delta f}{f_0} \frac{C_x}{C}(C_x - C)$$

Assuming that capacitor C has a capacitance of 1 pF and capacitor $C_x$ has a capacitance of 20 pF, $\Delta C_x$ would have a value of about 1.52 fF, which is about 380 times larger than the corresponding step change in the circuit shown in FIG. 17. The DCO topology shown in FIG. 17 would therefore be easier to implement.

Figure 18:
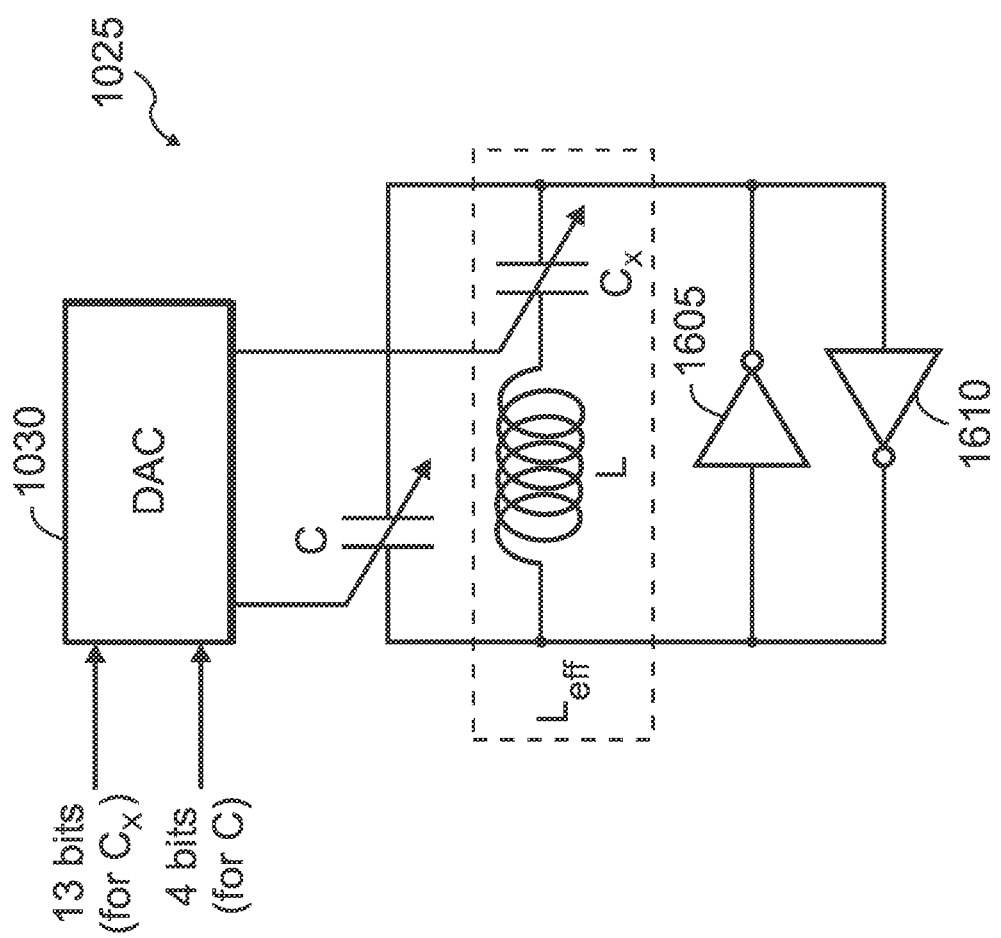
FIG. 18 shows a circuit arrangement for control of a single-ended DCO according to an exemplary embodiment.

FIG. 18 shows a circuit arrangement for controlling the frequency of single-ended DCO 1025 according to an exemplary embodiment. More specifically, the figure shows DAC 1030 receiving a set of control signals (from digital loop filter 1020, as shown in FIG. 1A or 1B), and using the set of control signals to vary the capacitances of capacitors C and C. DAC 1030 can drive analog voltages to control or vary the capacitances of capacitors C and $C_x$, assuming those capacitors are implemented as varactors. Alternatively, rather than using DAC 1030, a control circuit that includes logic circuitry and switches to program discrete capacitance values of capacitors C and $C_x$. In general, capacitors C and $C_x$ can be realized with a combination of programmable (discrete capacitance step changes) and varactor capacitors in a number of ways, as persons of ordinary skill in the art will understand. The choice of realization for a given implementation depends on a variety of factors, as persons of ordinary skill in the art will understand. Such factors include design specifications, performance specifications, cost, IC or device area, available technology, such as semiconductor fabrication technology, target markets, target end-users, etc.

Using the BLE example discussed above, assuming a frequency tuning range of ±10% (±100,000 ppm) and a DCO output signal frequency resolution (or step) of about 3.2 ppm, DAC 1030 would have to use about 16 bits of signals in the set of control signals. The total number of bits is partitioned between C and $C_x$, i.e., some of the bits are used to vary the capacitance of capacitor C, and the remaining bits in the set of control bits are used to vary the capacitance of capacitor C.

In exemplary embodiments, a discontinuity may exist in the overall capacitance provided by capacitors C and C. Given that assumption, the capacitance values of capacitors C and $C_x$ are designed to overlap (e.g., using capacitance values of capacitors C and $C_x$ that are non-radix 2). In addition, capacitor $C_x$ may be designed so that no fractional divide (as realized by MMD 1045 (see FIG. 1A or 1B)) value of the fractional value (n) causes a change in capacitor C. Thus, for the BLE example, changes in capacitor $C_x$ should cover the frequency range of at least 38.4 MHz out of 2.45 GHz, or 15,600 ppm. A 2 ppm resolution in the capacitance of capacitor $C_x$ implies 7,800 steps in capacitance value. Thus, 13 bits would be allocated to varying the capacitance value of capacitor $C_x$. An additional four bits would be allocated to varying the capacitance value of capacitor C. FIG. 18 shows this configuration.

Note, however, that the choice of the total number of bits in the set of control bits, the allocation of bits to capacitor C and capacitor $C_x$, and other such parameters and the resulting circuitry for a given implementation depends on a variety of factors, as persons of ordinary skill in the art will understand. Such factors include design specifications, performance specifications, cost, IC or device area, available technology, such as semiconductor fabrication technology, target markets, target end-users, etc. Thus, the example shown in FIG. 18 is merely illustrative, and other DCO realizations may be used, as desired.

Figure 19:
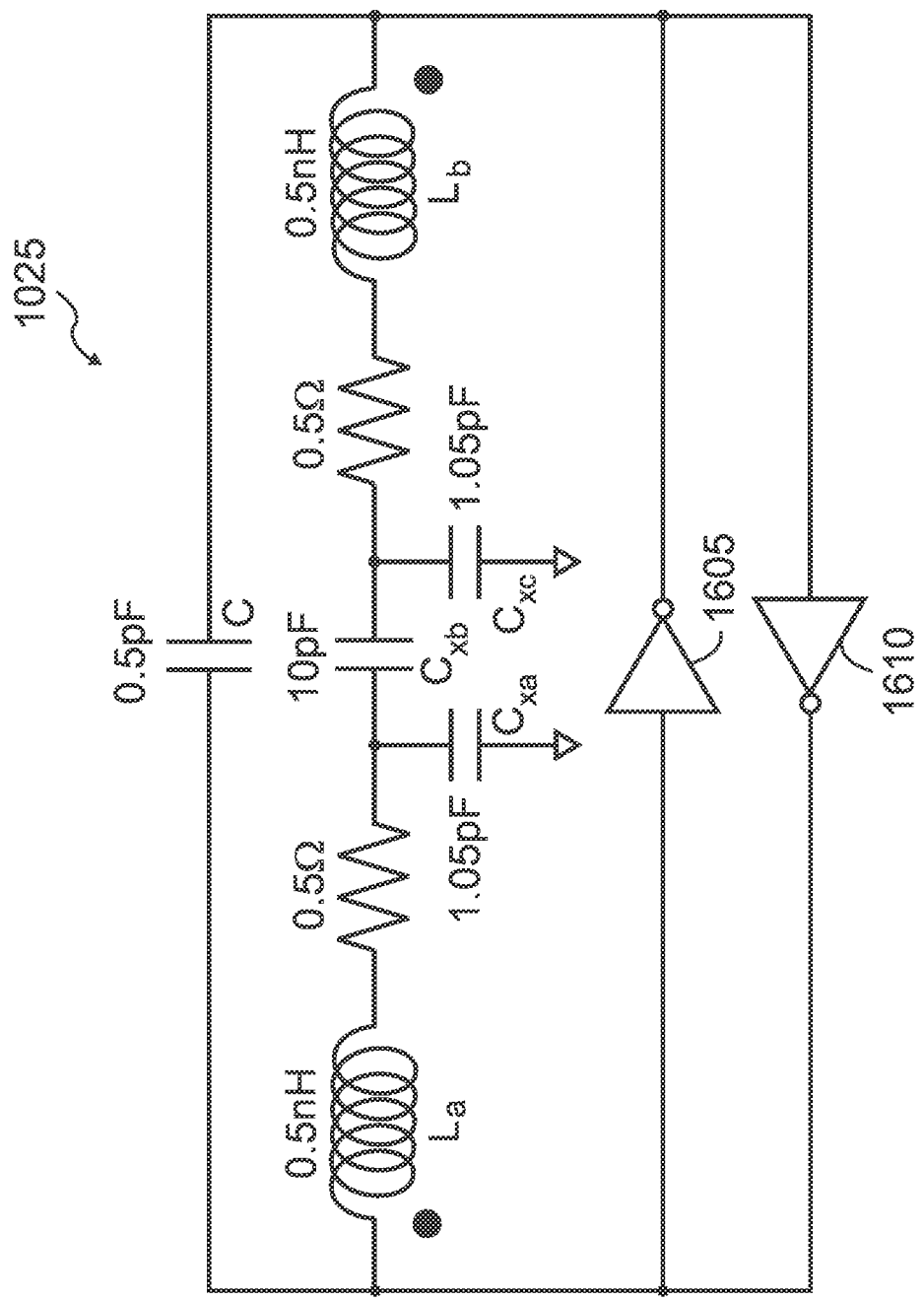
FIG. 19 shows a circuit arrangement of a differential mode DCO according to an exemplary embodiment.

Instead of single-ended DCOs, in some applications differential mode DCOs may be used, as desired. FIG. 19 shows a circuit arrangement of a differential mode DCO 1025 according to an exemplary embodiment (DAC 1030 is not shown). In this topology, inductor L is realized by using two inductors $L_a$ and $L_b$, coupled in series, as shown. In addition, capacitor $C_x$ is realized by using three capacitors coupled in a Π-configuration (or "pi-configuration" to denote the capital Greek letter pi), which includes capacitors $C_{xa}$, $C_{xb}$, and $C_{xc}$. In the embodiment shown, capacitor $C_{xb}$ has a fixed value, and the capacitances of capacitors $C_{xa}$ and $C_{xc}$ are varied by DAC 1030 (not shown), as described above. Note that the resistors represent the parasitic series resistances of inductors $L_a$ and $L_b$, and/or the effective series resistance of capacitors that realize capacitor $C_x$ to model passive losses in DCO 1025. In some situations, the resistors have relatively small values, and may be omitted from the circuit and/or design calculations, as persons of ordinary skill in the art will understand.

For the BLE example discussed above, the components have the values shown in FIG. 19. Note the dot-convention of the two inductors which, conceptually denotes the direction in which the turns of conductor in the inductors are "wound" (or realized in some manner in an IC, etc.). For the topology in FIG. 19, the dot-convention denotes that the turns of conductor in inductor $L_a$ are "wound" in the opposite direction of the turns of conductor in inductor $L_b$ (e.g., clockwise versus counterclockwise). Using this configuration, the effective inductance of inductor $L_a$, $L_{a\text{-}effective}$, may be represented as:

$$L_{a\text{-}effective}=(L_a-M)=L_a(1-k),$$

where M represents the mutual inductance between inductors $L_a$ and $L_b$, and where k represents the coupling coefficient between inductors $L_a$ and $L_b$. Similarly, for inductor $L_b$, the effective inductance of inductor $L_b$, $L_{b\text{-}effective}$, may be represented as $$L_b\text{-effective}=(L_b-M)=L_b(1-k).$$

Figure 20:
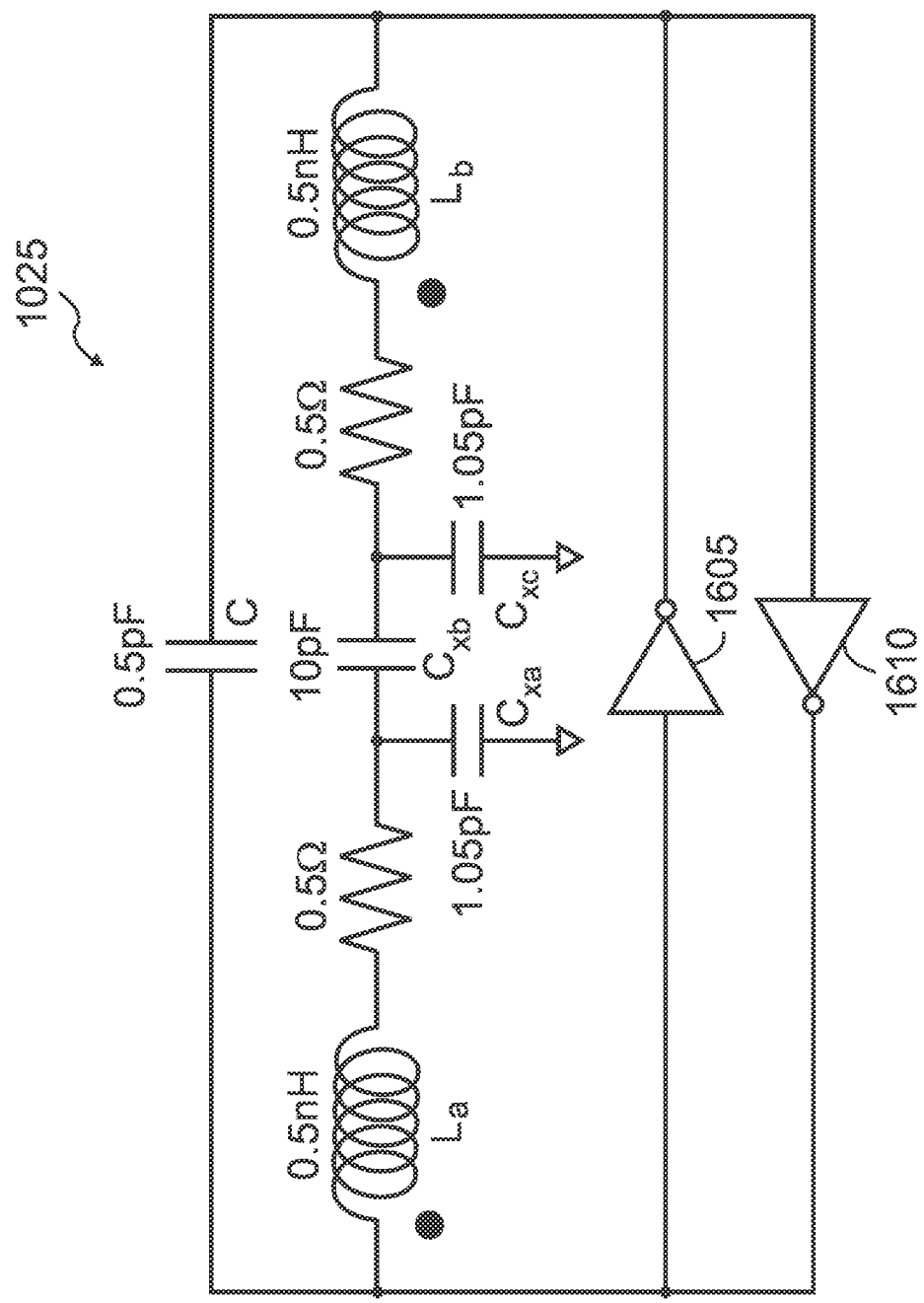
FIG. 20 shows a circuit arrangement of a differential mode DCO according to another exemplary embodiment.

The dot-convention for inductors $L_a$ and $L_b$ may be changed to arrive an alternative exemplary embodiment for a differential mode DCO. FIG. 20 shows a circuit arrangement for that topology (DAC 1030 is not shown). The circuit configuration is similar to the embodiment shown in FIG. 19, except that the dot-convention for inductors $L_a$ and $L_b$ signifies that the turns of conductor in inductor $L_a$ are "wound" in the same direction as the turns of conductor in inductor $L_b$. Using this configuration, the effective inductances of inductors $L_a$ and $L_b$ may be represented, respectively, as:

$$L_{a\text{-}effective}=(L_a+M)=L_a(1+k),$$

and $$L_{b\text{-}effective}=(L_b+M)=L_b(1+k).$$

From the above description, one may note that the inductance L in the DCO topology shown in FIG. 19 has a lower value than it does in the DCO topology shown in FIG. 20. On the other hand, the DCO topology shown in FIG. 20 is more immune to interfering signals that would appear as a common-mode signal to the circuitry in the VCO. The above factors may be considered in choosing the topology in FIG. 19 versus the topology in FIG. 20. In addition or instead, however, the choice of topology may be predicated on other parameters or factors, as persons of ordinary skill in the art will understand. Such factors include design specifications, performance specifications, cost, IC or device area, available technology, such as semiconductor fabrication technology, target markets, target end-users, etc., for a given implementation or situation.

Figure 21:
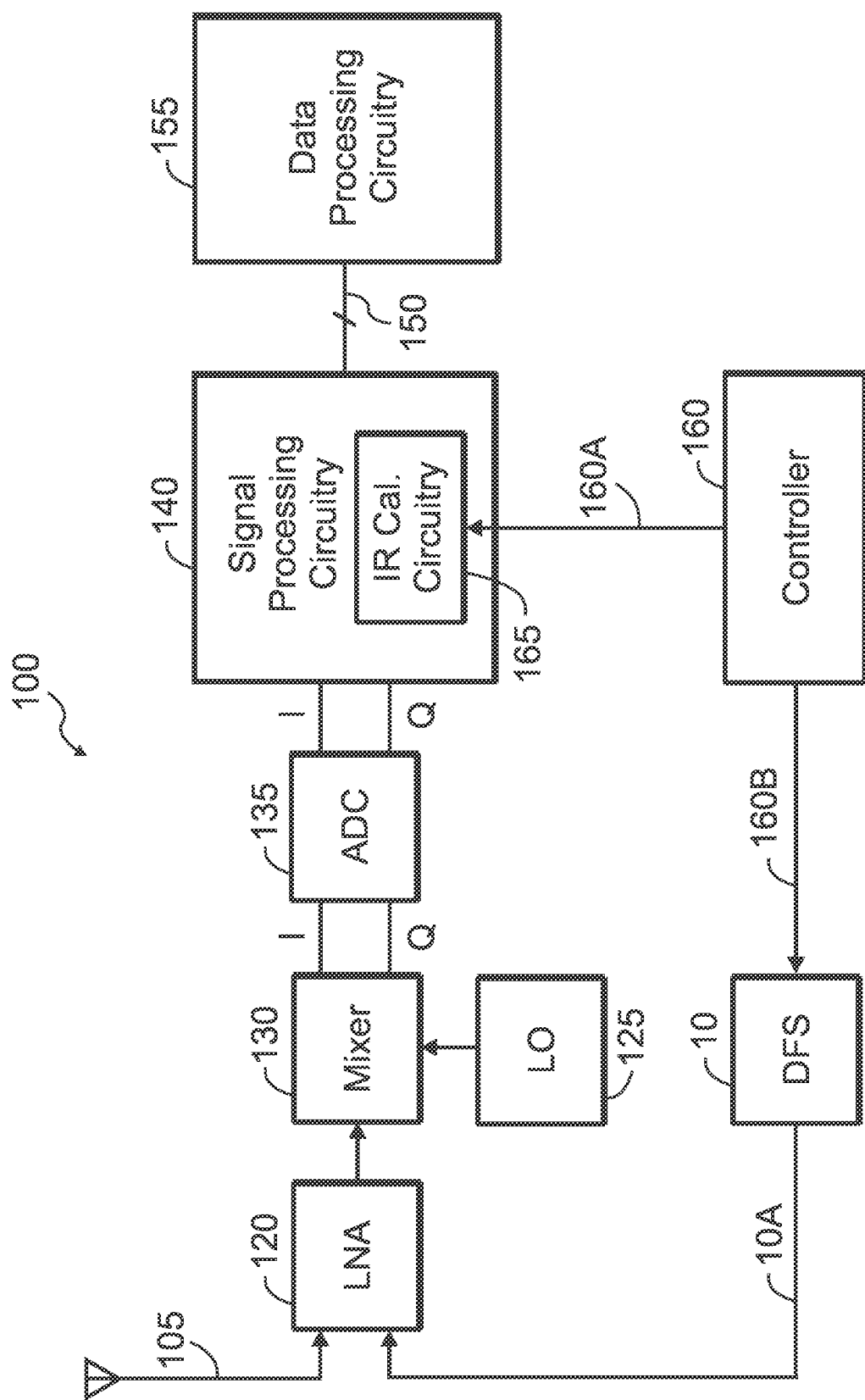
FIG. 21 shows a circuit arrangement for an RF receiver, including a DFS, according to an exemplary embodiment.

As noted above, without limitation, DFSs (including TDCs and/or DCOs) according to exemplary embodiments may be used in a variety of applications. Examples include RF receivers, RF transmitters, and RF transceivers. FIG. 21 shows a circuit arrangement for an RF receiver 100, including DFS 10, according to an exemplary embodiment. Receiver 100 receives RF signals via antenna 105. The RF signals feed an input of low noise amplifier (LNA) 120. LNA 120 provides low-noise amplification of the RF signals, and provides amplified RF signals to mixer 130.

Mixer 130 performs frequency translation or shifting of the RF signals, using a reference or local oscillator (LO) frequency provided by LO 125. For example, in some embodiments, mixer 30 translates the RF signal frequencies to baseband frequencies. As another example, in some embodiments, mixer 30 translates the RF signal frequencies to an intermediate frequency (IF).

Mixer 130 provides the translated output signal as a set of two signals, an in-phase (I) signal, and a quadrature (Q) signal. The I and Q signals are analog time-domain signals. Analog-to-digital converter (ADC) 135 converts the I and Q signals to digital I and Q signals. In exemplary embodiments, ADC 135 may use a variety of signal conversion techniques. For example, in some embodiments, ADC 135 may use delta-sigma (or sometimes called sigma-delta) analog-to-digital conversion.

ADC 135 provides the digital I and Q signals to signal processing circuitry 140. Generally speaking, signal processing circuitry 140 performs processing on the digital I and Q signals, for example, digital signal processing (DSP). Signal processing circuitry 140 provides information, such as the demodulated data, to data processing circuitry 155 via link 150. Data processing circuitry 155 may perform a variety of functions (e.g., logic, arithmetic, etc.). For example, data processing circuitry 155 may use the demodulated data in a program, routine, or algorithm (whether in software, firmware, hardware, or a combination) to perform desired control or data processing tasks.

In some embodiments, data processing circuitry 155 may perform control of other circuitry, sub-system, or systems (not shown). In some embodiments, data processing circuitry 155 may provide the data (after processing, as desired, for example, filtering) to another circuit (not shown), such as a transducer, display, etc.

In exemplary embodiments, link 150 may take a variety of forms. For example, in some embodiments, link 150 may constitute a number of conductors or coupling mechanisms, such as wires, cables, printed circuit board (PCB) traces, etc. Through link 150, signal processing circuitry 140 and data processing circuitry 155 may exchange information, such as the demodulated data, control information or signals, status signals, etc., as desired.

Receiver 100 includes image reject (IR) calibration circuitry 165 that may be used to perform image reject calibration, as mentioned above. Receiver 100 further includes controller 160. Controller 160 uses an output signal 160A to control the operation of IR calibration circuitry 165. Controller 160 further uses output signal 160B to control the operation of DFS 10, e.g., cause DFS 10 to provide an output signal 10A as a test tone to the receiver. The test tone is typically injected into the receive path circuitry at a strategic location. In the exemplary embodiment shown in FIG. 21, the test tone output by DFS 10 is applied at the input of low-noise amplifier (LNA) 120. IR calibration circuitry 165 residing after analog-to-digital converter (ADC) 135 utilizes the LMS technique (or an alternate the technique) to calibrate the image rejection of the receive path circuitry . . . .

Figure 22:
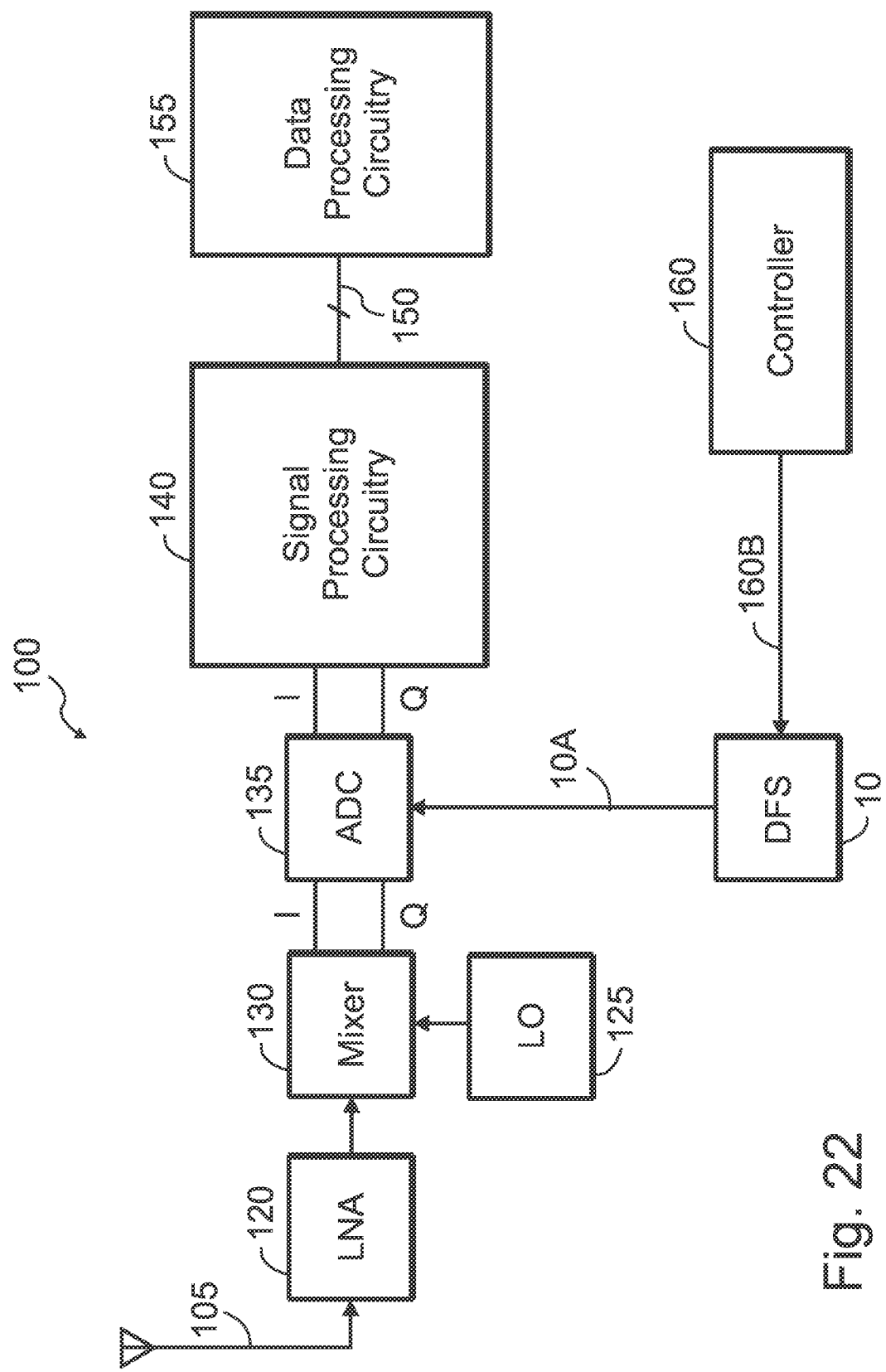
FIG. 22 shows a circuit arrangement for an RF receiver, including a DFS, according to an exemplary embodiment.

As noted above, DFSs according to various embodiments may be used to clock ADC 135. FIG. 22 shows such an arrangement. In this scenario, DFS 10 provides output signal 10A to ADC 135 in response to control signal 160B from controller 160. ADC 135 uses output signal 10A of DFS 10 as a clock signal in order to perform analog-to-digital conversion.

Figure 23:
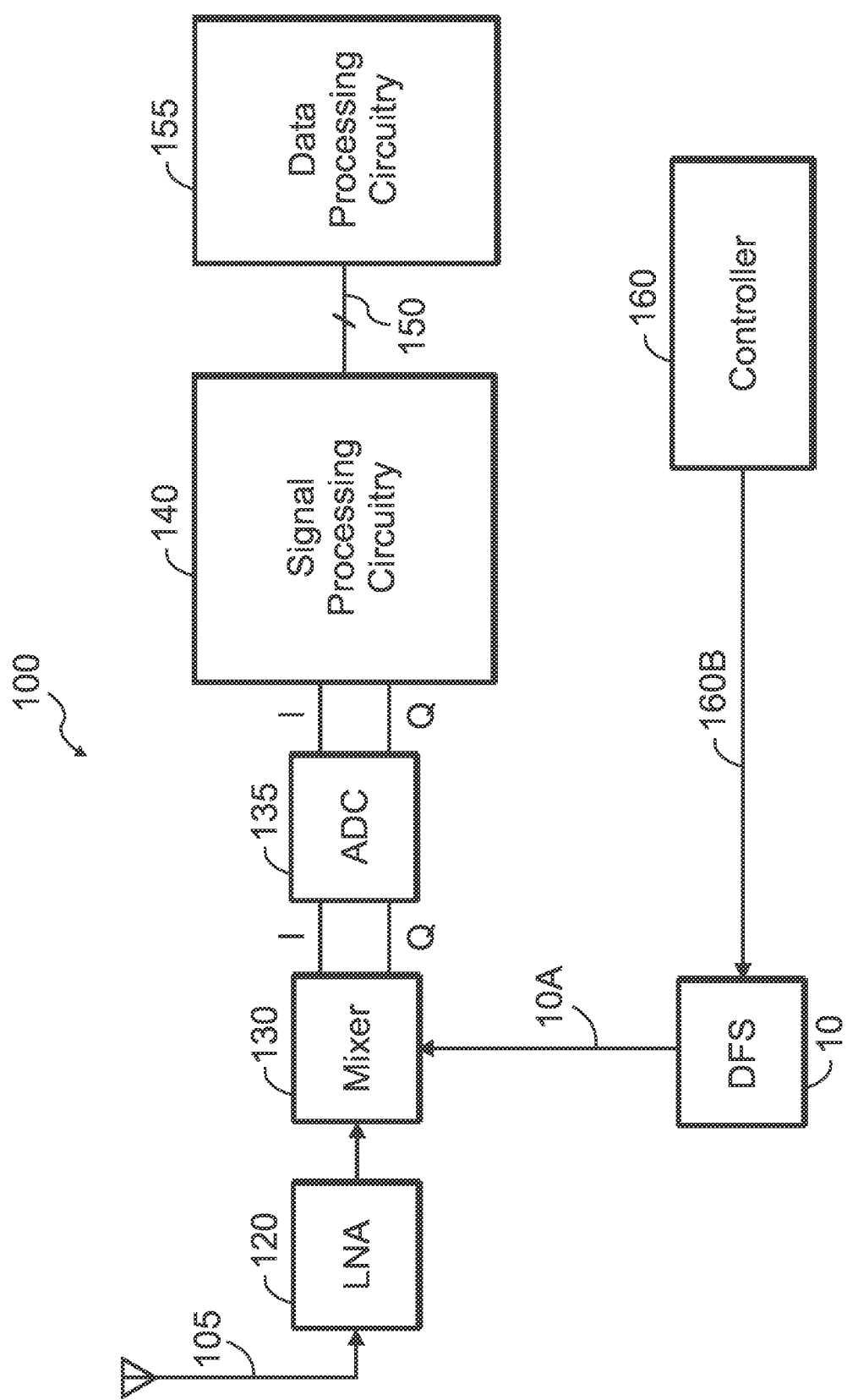
FIG. 23 shows a circuit arrangement for an RF receiver, including a DFS, according to an exemplary embodiment.

As further noted above, DFSs according to various embodiments may be used to perform mixing operations. FIG. 23 shows such an arrangement. In this embodiment, LO 125 (see FIGS. 4-5) is omitted. Instead, output signal 10A of DFS 10 is used as an LO signal. DFS 10 provides output signal 10A to mixer 130 in response to control signal 160B from controller 160. Output signal 10A is used by mixer 130 to mix an RF signal with output signal 10A in order to generate the I and Q (in-phase and quadrature) signals that are provided to ADC 135.

Figure 24:
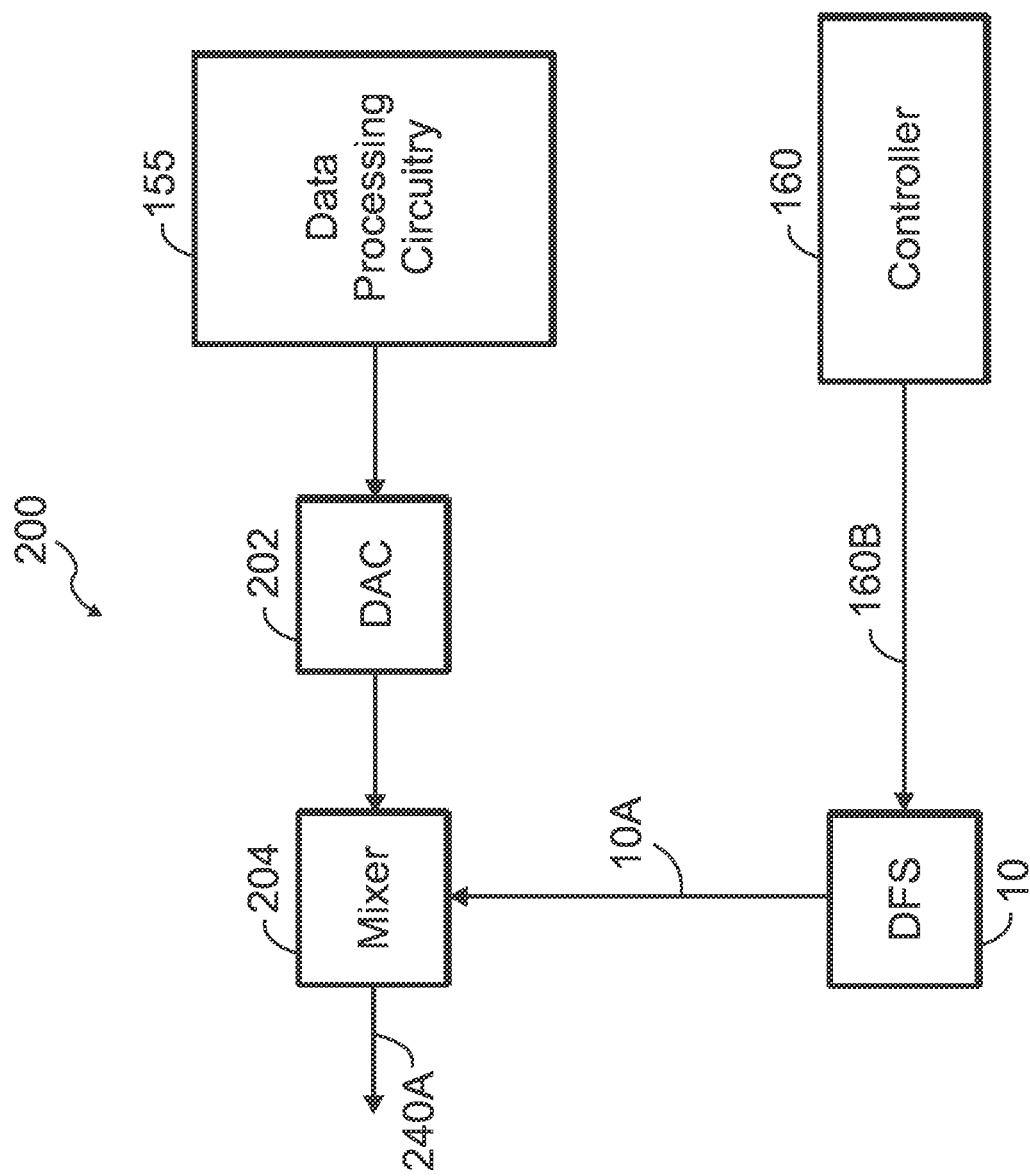
FIG. 24 shows a circuit arrangement for an RF transmitter, including a DFS, according to an exemplary embodiment.

As noted above, DFSs according to various embodiments may be used in RF transmitters. FIG. 24 shows a circuit arrangement for an RF transmitter (TX) 200, including DFS 10, according to an exemplary embodiment. Data processing circuitry 155 provides a digital signal to digital-to-analog converter (DAC) 202. DAC 202 converts the digital signal to an analog signal and provides the analog signal to mixer 204.

In response to control signal 160B from controller 160, DFS 10 generates output signal 10A with a desired frequency (typically in the RF range). Mixer 204 mixes the output signal of DAC 202 with output signal 10A of DFS 10. The resulting output signal 204A of mixer 204 may be provided to a power amplifier (not shown) or be further processed as part of the operations of transmitter 200.

Note that RF receiver 100 and RF transmitter 200 shown in the figures and described above constitute mere examples. As persons of ordinary skill in the art will understand, DFSs according to various embodiments may be used in a variety of RF receivers (e.g., direct conversion, low-intermediate-frequency (low-IF), etc.) and RF transmitters (direct-conversion, offset-PLL, etc.), as desired.

Note further that DFSs according to various embodiments may also be used in RF transceivers. For example, by combining the functionality and/or circuitry of RF receivers that include one or more DFSs with the functionality and/or circuitry of RF transmitters that include one or more DFSs, RF transceivers may be realized, as persons of ordinary skill in the art will understand. In some embodiments, one or more DFSs may be shared between the RF receiver and the RF transmitter, as persons of ordinary skill in the art will understand.

Figure 25:
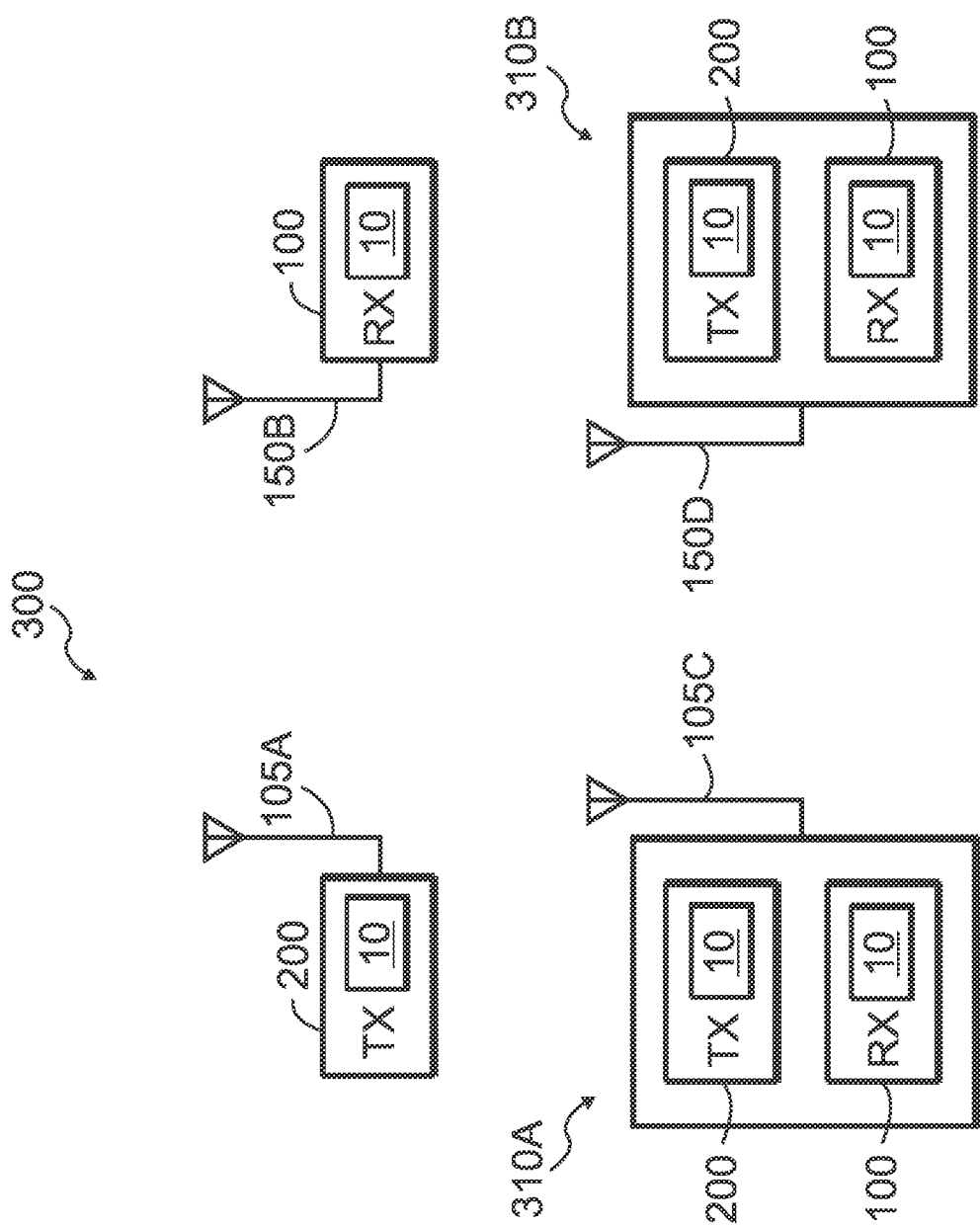
FIG. 25 shows a circuit arrangement for an RF communication system according to an exemplary embodiment.

Furthermore, RF receivers, RF transmitters, and/or RF transceivers including DFSs according to various embodiments may be used in a variety of communication arrangements, systems, sub-systems, networks, etc., as desired. FIG. 25 shows a circuit arrangement for an RF communication system 300 according to an exemplary embodiment.

System 300 includes a transmitter 200, coupled to antenna 105A. Via antenna 105A, transmitter 200 transmits RF signals. The RF signals may be received by receiver 100, described above. In addition, or alternatively, transceiver 310A and/or transceiver 310B might receive (via receiver 100) the transmitted RF signals.

In addition to receive capability, transceiver 310A and transceiver 310B can also transmit RF signals. The transmitted RF signals might be received by receiver 100, either in the stand-alone receiver, or via the receiver circuitry of the non-transmitting transceiver.

Other systems or sub-systems with varying configuration and/or capabilities are also contemplated. For example, in some exemplary embodiments, two or more transceivers (e.g., transceiver 310A and transceiver 310B) might form a network, such as an ad-hoc network, a mesh network, etc. As another example, in some exemplary embodiments, transceiver 310A and transceiver 310B might form part of a network, for example, in conjunction with transmitter 200.

Figure 26:
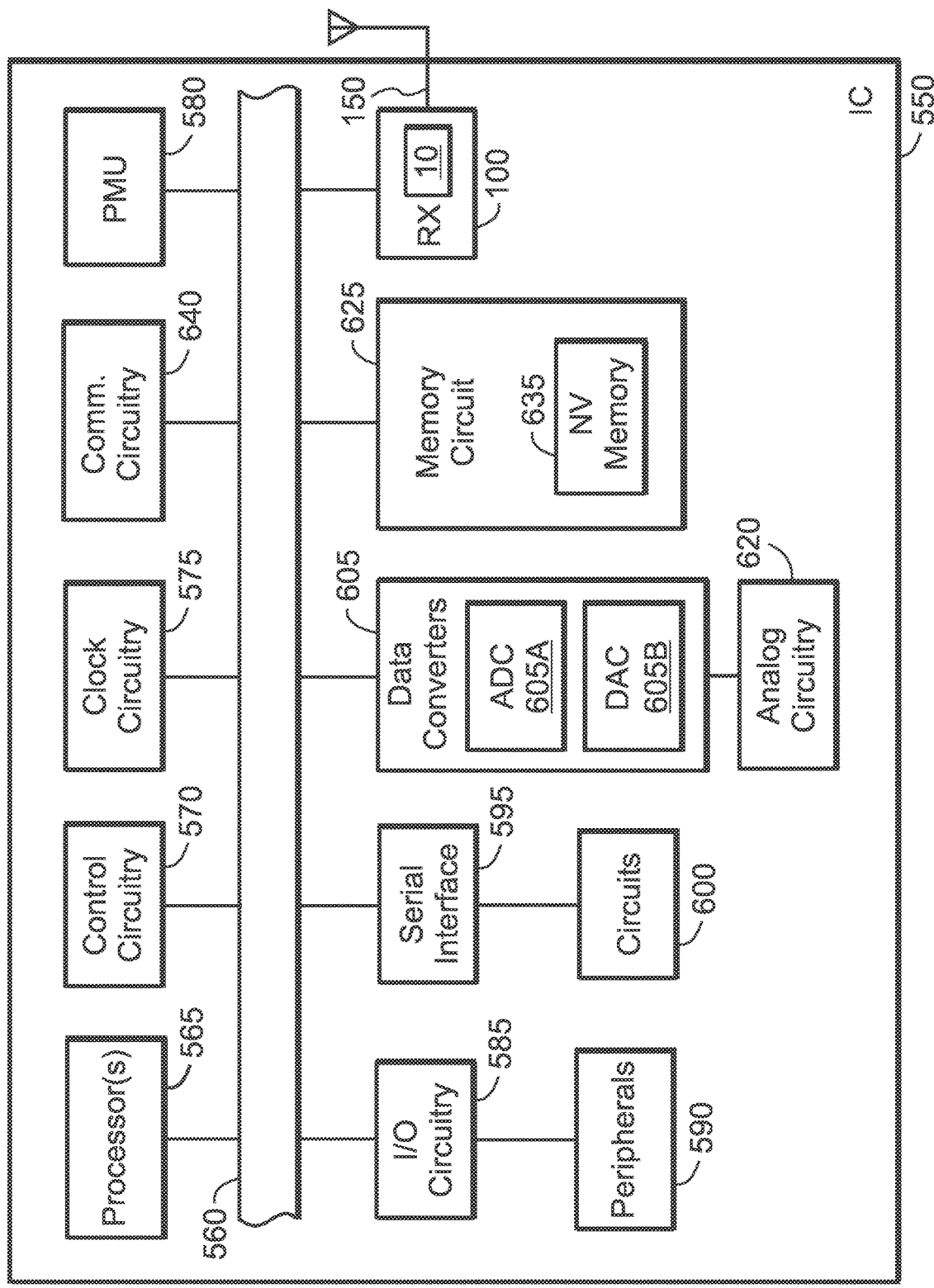
FIG. 26 shows a circuit arrangement for an IC, including a receiver that includes one or more DFSs, according to an exemplary embodiment.

RF receivers and RF transmitters, such as RF receiver 100 and RF transmitter 200 described above, may be used in a variety of circuits, blocks, subsystems, and/or systems. For example, in some embodiments, such RF receivers may be integrated in an IC, such as an MCU. FIG. 26 shows a circuit arrangement for an IC, including RF receiver 100 that includes one or more DFSs (e.g., as shown in FIGS. 21-23), according to an exemplary embodiment.

The circuit arrangement includes an IC 550, which constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductor elements (e.g., traces, devices, etc.) for communicating information, such as data, commands, status information, and the like.

IC 550 may include link 560 coupled to one or more processors 565, clock circuitry 575, and power management circuitry or power management unit (PMU) 580. In some embodiments, processor(s) 565 may include circuitry or blocks for providing information processing (or data processing or computing) functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired. In some embodiments, functionality of parts of receiver 100, such as those described above, may be implemented or realized using some of the circuitry in processor(s) 565, as desired Referring again to FIG. 26, clock circuitry 575 may generate one or more clock signals that facilitate or control the timing of operations of one or more blocks in IC 550. Clock circuitry 575 may also control the timing of operations that use link 560, as desired. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, disable (or power down or place in a lower power consumption or sleep or inactive or idle state), enable (or power up or place in a higher power consumption or normal or active state) or any combination of the foregoing with respect to part of a circuit or all components of a circuit, such as one or more blocks in IC 550. Further, PMU 580 may turn on a clock, increase a clock rate, turn on power, increase power, or any combination of the foregoing in response to a transition from an inactive state to an active state (including, without limitation, when processor(s) 565 make a transition from a low-power or idle or sleep state to a normal operating state).

Link 560 may couple to one or more circuits 600 through serial interface 595. Through serial interface 595, one or more circuits or blocks coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with one or more blocks coupled to link 560, e.g., processor(s) 565, memory circuit 625, etc.

In exemplary embodiments, peripherals 590 may include a variety of circuitry, blocks, and the like. Examples include I/O devices (keypads, keyboards, speakers, display devices, storage devices, timers, sensors, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. In some embodiments, such peripherals may be external to IC 550, as described above.

Link 560 may couple to analog circuitry 620 via data converter(s) 605. Data converter(s) 605 may include one or more ADCs 605A and/or one or more DACs 605B.

ADC(s) 605A receive analog signal(s) from analog circuitry 620, and convert the analog signal(s) to a digital format, which they communicate to one or more blocks coupled to link 560. Conversely, DAC(s) 605B receive digital signal(s) from one or more blocks coupled to link 560, and convert the digital signal(s) to analog format, which they communicate to analog circuitry 620.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, sub-systems, control blocks or systems, feedback systems, and information processing blocks, as desired.

Control circuitry 570 couples to link 560. Thus, control circuitry 570 may communicate with and/or control the operation of various blocks coupled to link 560 by providing control information or signals. In some embodiments, control circuitry 570 also receives status information or signals from various blocks coupled to link 560. In addition, in some embodiments, control circuitry 570 facilitates (or controls or supervises) communication or cooperation between various blocks coupled to link 560.

In some embodiments, control circuitry 570 may initiate or respond to a reset operation or signal. The reset operation may cause a reset of one or more blocks coupled to link 560, of IC 550, etc., as person of ordinary skill in the art will understand. For example, control circuitry 570 may cause PMU 580, and circuitry such as RF receiver 10, to reset to an initial or known state.

In exemplary embodiments, control circuitry 570 may include a variety of types and blocks of circuitry. In some embodiments, control circuitry 570 may include logic circuitry, finite-state machines (FSMs), or other circuitry to perform operations such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples of communications include USB, Ethernet, and the like. In exemplary embodiments, other communication protocols may be used, depending on factors such as design or performance specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc.

Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, DDR4, and the like, as desired.

In some embodiments, memory read and/or write operations by memory circuit 625 involve the use of one or more blocks in IC 550, such as processor(s) 565. A direct memory access (DMA) arrangement (not shown) allows increased performance of memory operations in some situations. More specifically, DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown), such as random access memory (RAM). NV memory 635 may be used for storing information related to performance, control, or configuration of one or more blocks in IC 550. For example, NV memory 635 may store configuration information related to RF receiver 100 and/or to initial or ongoing configuration or control of RF receiver 100 (including DFS(s) included in RF receiver 100), as desired.

Figure 27:
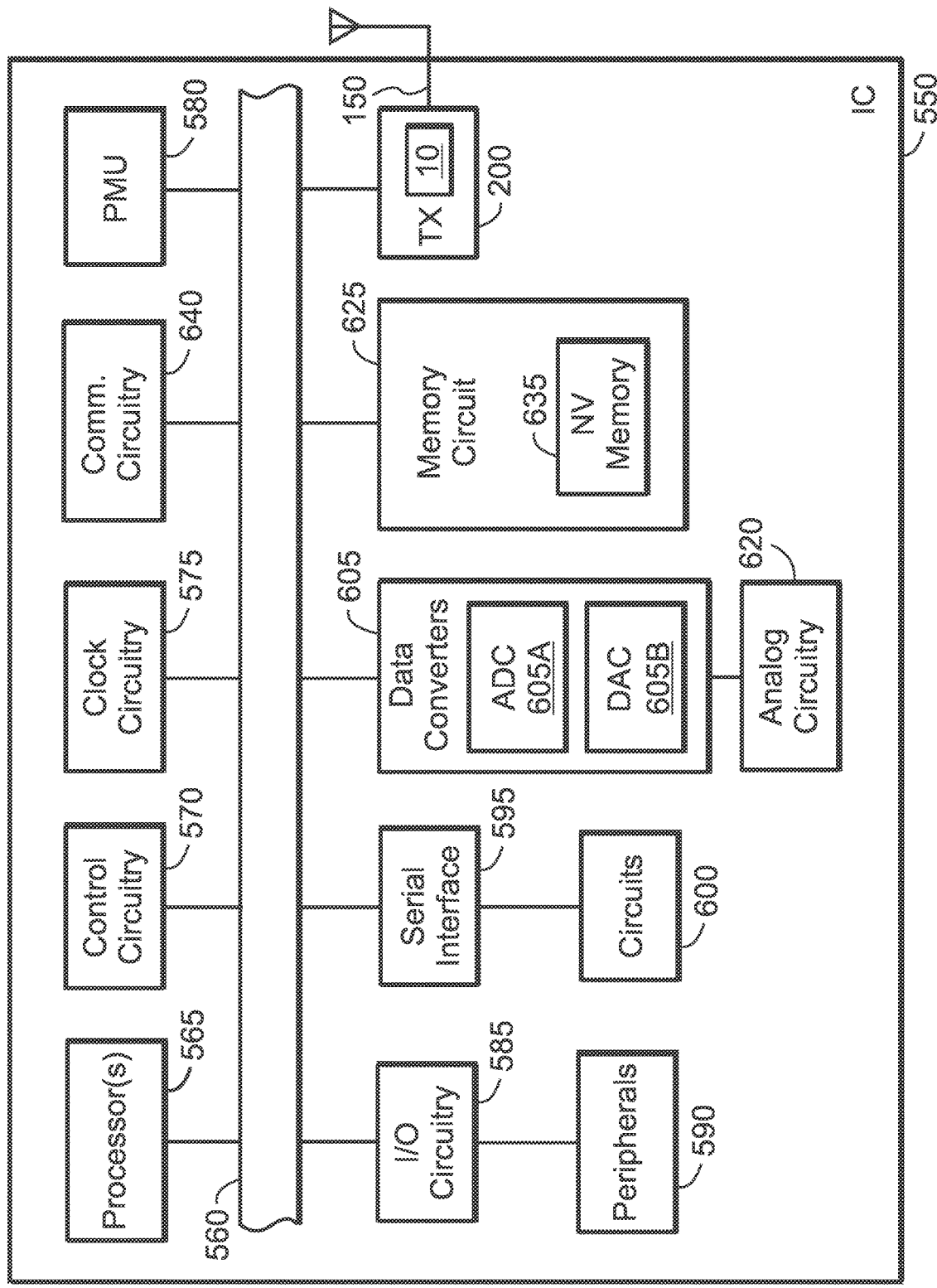
FIG. 27 shows a circuit arrangement for an IC, including a transmitter that includes one or more DFSs, according to an exemplary embodiment.

As noted, DFSs according to various embodiments may also be used in RF transmitters. Such RF transmitters may be included in various electronic circuitry, such as ICs. FIG. 27 shows a circuit arrangement for an IC 500, including an RF transmitter 200 that includes one or more DFSs, according to an exemplary embodiment. RF transmitter 200 may be coupled to and operate in conjunction with various blocks and circuitry in IC 550, as described above.

Various circuits and blocks described above and used in exemplary embodiments may be implemented in a variety of ways and using a variety of circuit elements or blocks. For example, DFS 10, TDC 1005, MMD 1045, subtracter 1015, scaling circuit 1055, digital loop filter 1020, DCO 1025, DAC 1030, divider 1035, SDM 1060, delay circuit 1050, LMS adaptation circuit 1040, residue error circuit 1010, jitter monitor circuit 1017, C-TDC 1100, F-TDC 1105, delay circuit 1110, control circuit 1115, flip-flop 1210, control circuit 1205, synchronous counter 1220, oscillator 1215, flip-flops 1275, encoder logic circuit 1270, MUX 1255, inverter 1250, wrap counter 1265, MUX control circuit 1260, one's complement circuit 1305, adder 1310, register 1325, scaling circuit 1315, adder 1320, register 1330, adder 1060A, adder 1060B, DDC 1060K, integrator 1060C, adder 1060D, integrator 1060F, adder 1060G, PRBS dither circuit 1060E, quantizer 1060H, delay circuit 10601, adder 1060J, scaling circuit 1060N, scaling circuit 1060P, scaling circuit 1060Q, inverter 1605, inverter 1610, and various blocks shown in FIGS. 21-27 that contain digital or mixed-signal circuitry may generally be implemented using gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, custom analog cells, etc., as desired, and as persons of ordinary skill in the art will understand.

In addition, analog circuitry or mixed-signal circuitry or both may be included, for instance, power converters, discrete devices (transistors, capacitors, resistors, inductors, diodes, etc.), and the like, as desired. The analog circuitry in the blocks and circuits above may be implemented using bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand. The mixed-signal circuitry may include analog-to-digital converters (ADCs), digital-to-analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus comprising: a sigma-delta modulator (SDM) having three modes of operation; wherein an integer (N) is provided as a first input to the SDM; wherein an output signal of the SDM toggles between two values derived from the integer (N); and wherein a derivation of the two values depends on whether the SDM is operating in a first mode, a second mode, or a third mode of the three modes of operation.

2. The apparatus according to claim 1, wherein a fraction (n) is provided as a second input to the SDM.

3. The apparatus according to claim 1, wherein in the first mode the output signal of the SDM toggles between N and N+1.

4. The apparatus according to claim 1, wherein in the second mode the output signal of the SDM toggles between N−1 and N+1.

5. The apparatus according to claim 1, wherein in the third mode the output signal of the SDM toggles between N and N+2.

6. The apparatus according to claim 1, wherein the SDM is a second-order SDM or a third-order SDM.

7. An apparatus comprising: a sigma-delta modulator (SDM) having a first mode, a second mode, and a third mode of operation; wherein a fractional divide parameter (n) is provided as an input to the SDM; and wherein a value of the fractional divide parameter (n) determines whether the SDM operates in the first mode, the second mode, or the third mode of operation.

8. The apparatus according to claim 7, wherein the SDM generates an output signal for a Bluetooth Low-Energy (BLE) application.

9. The apparatus according to claim 7, wherein the SDM operates in the first mode of operation responsive to the value of the fractional divide parameter (n) being between 0.25 and 0.75.

10. The apparatus according to claim 7, wherein the SDM operates in a second mode of operation responsive to the value of the fractional divide parameter (n) being less than or equal to 0.25.

11. The apparatus according to claim 7, wherein the SDM operates in a third mode of operation responsive to the value of the fractional divide parameter (n) being greater than or equal to 0.75.

12. A method of operating a digital frequency synthesizer (DFS), the method comprising; generating an output signal from a sigma-delta modulator (SDM) having a first mode, a second mode, and a third mode of operation; providing a fractional divide parameter (n) as an input to the SDM; and selecting the first mode, the second mode, or the third mode of operation for operation of the SDM according to a value of the fractional divide parameter (n).

13. The method according to claim 12, wherein an integer (N) is provided as an input to the SDM, and wherein in the first mode of operation of the SDM the output signal of the SDM toggles between N and N+1.

14. The method according to claim 12, wherein an integer (N) is provided as an input to the SDM, and wherein in the second mode of operation of the SDM the output signal of the SDM toggles between N−1 and N+1.

15. The method according to claim 12, wherein an integer (N) is provided as an input to the SDM, and wherein in the third mode of operation of the SDM the output signal of the SDM toggles between N and N+2.

16. The method according to claim 12, wherein the SDM is a second-order SDM or a third-order DSM.

17. The apparatus according to claim 1,
wherein in the first mode of operation the two values of the output signal of the SDM are N and N+1;
wherein in the second mode of operation the two values of the output signal are N−1 and N+1; and
wherein in the third mode of operation the two values of the output signal are N and N+2.

18. The apparatus according to claim 1 further comprising a digital frequency synthesizer (DFS) that includes the SDM.

19. The apparatus according to claim 7 further comprising a digital frequency synthesizer (DFS) that includes the SDM.

20. The apparatus according to claim 7,
wherein the SDM operates in the first mode responsive to a value of the fractional divide parameter (n) being in a first range;
wherein the SDM operates in the second mode responsive to the value of the fractional divide parameter (n) being in a second range; and
wherein the SDM operates in the third mode responsive to the value of the fractional divide parameter (n) being in a third range.

21. The apparatus according to claim 20, wherein the first range is between 0.25 and 0.75, the second range is less than or equal to 0.25, and the third range is greater than or equal to 0.75.

22. The method according to claim 12 further comprising:
providing an integer (N) as an input to the SDM;
toggling the output signal of the SDM between N and N+1 in the first mode of operation;
toggling the output signal of the SDM between N−1 and N+1 in the second mode of operation; and
toggling the output signal of the SDM between N and N+2 in the third mode of operation.

* * * * *

UNITED STATES PATENT AND TRADEMARK OFFICE
CERTIFICATE OF CORRECTION

| | |
|---|---|
| PATENT NO. | : 11,817,868 B2 |
| APPLICATION NO. | : 17/855525 |
| DATED | : November 14, 2023 |
| INVENTOR(S) | : John M. Khoury |

It is certified that error appears in the above-identified patent and that said Letters Patent is hereby corrected as shown below:

In the Specification

In Column 1, Line 17, please replace "16/221,130" with --16/221,430--.

Signed and Sealed this
Second Day of January, 2024

Katherine Kelly Vidal
*Director of the United States Patent and Trademark Office*